US007166916B2

United States Patent
Akamatsu et al.

(10) Patent No.: US 7,166,916 B2
(45) Date of Patent: Jan. 23, 2007

(54) MANUFACTURING METHOD FOR SEMICONDUCTOR INTEGRATED CIRCUIT, SEMICONDUCTOR INTEGRATED CIRCUIT, AND SEMICONDUCTOR INTEGRATED CIRCUIT APPARATUS

(75) Inventors: Tetsuya Akamatsu, Tenri (JP); Masanori Inamori, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 130 days.

(21) Appl. No.: 10/996,857

(22) Filed: Nov. 23, 2004

(65) Prior Publication Data

US 2005/0224962 A1  Oct. 13, 2005

(30) Foreign Application Priority Data

Mar. 31, 2004 (JP) .............................. 2004-105944

(51) Int. Cl.
 *H01L 23/34* (2006.01)
(52) U.S. Cl. ...................................... 257/724; 257/690

(58) Field of Classification Search ........ 257/723–725, 257/690
See application file for complete search history.

(56) References Cited

U.S. PATENT DOCUMENTS

2005/0224962 A1* 10/2005 Akamatsu et al. .......... 257/724

FOREIGN PATENT DOCUMENTS

JP 2002-246535 8/2002

* cited by examiner

*Primary Examiner*—Mark V. Prenty
(74) *Attorney, Agent, or Firm*—David C. Conlin; David A. Tucker; Edwards Angell Palmer & Dodge LLP

(57) ABSTRACT

A semiconductor integrated circuit is so structured that a first insulating layer is formed on a surface of a semiconductor chip and a second insulating layer covers an entire region of the surface of the semiconductor chip. Via apertures made to the second insulating layer, an electrical connection configuration is formed from above the second insulating layer by using gold wires. Then, an electronic component is mounted on the second insulating layer. By arranging as such, the electronic component is mounted on the semiconductor chip in advance. Therefore, it is possible to further reduce mounting space on a printed-wiring board and also possible to make is easy to attain one-packaged IC.

24 Claims, 11 Drawing Sheets

MANUFACTURING METHOD FOR SEMICONDUCTOR INTEGRATED CIRCUIT, SEMICONDUCTOR INTEGRATED CIRCUIT, AND SEMICONDUCTOR INTEGRATED CIRCUIT APPARATUS

This Nonprovisional application claims priority under 35 U.S.C. § 119(a) on Patent Application No. 105944/2004 filed in Japan on Mar. 31, 2004, the entire contents of which are hereby incorporated by reference.

FIELD OF THE INVENTION

The present invention relates to a manufacturing method for a semiconductor integrated circuit and a semiconductor integrated circuit, and more particularly, to how to attain a reduction of mounting space and to make it easy to attain one-packaged IC.

BACKGROUND OF THE INVENTION

In recent years, electronic instruments are becoming smaller, thinner, and higher in performance by developments of technologies for semiconductor integrated circuits. In accordance with this, a semiconductor chip and an electronic component are also becoming smaller. Under these circumstances, in order to house, in a small case, a circuit having a larger scale and being more complex, a semiconductor package and the electronic component are required to be mounted with higher density than before. To meet these requirements, the electronic component having a passive element (such as a resistor, capacitor, or the like) mounted on a printed-wiring board along with the semiconductor package is mounted, by a surface-mount technology, as a chip component of a ceramics package. The size of the electronic component is becoming smaller from 1005 size to 0603 size.

However, even though the semiconductor integrated circuit and the passive element are becoming smaller, it is always necessary to have a two-dimensional space for mounting components thereon so as to connect the semiconductor integrated circuit and the passive component. This hinders attaining further miniaturization of entire apparatus and a further shorter electrical distance between the semiconductor integrated circuit and the passive component.

To solve the above problems, a structure in which the electronic component is mounted on the semiconductor chip is proposed. Such a structure is disclosed in Japanese Laid-Open Publication No. 246535/2002 (published on Aug. 30, 2002). In the structure, a surface of a semiconductor chip on which a plurality of connection electrodes are arranged is so covered with a lower insulating film that the connection electrodes are left uncovered with the lower insulating film. On the lower insulating film, a plurality of wiring patterns are formed. One end of the wiring patterns is connected with the connection electrodes and the other end has component connection part. The wiring patterns are so covered with an upper insulating film that the component connection parts are left uncovered with the upper insulating film, and a discrete electronic component is connected between different component connection parts.

However, conventional semiconductor integrated circuits have following problems. FIG. 10 illustrates a conventional semiconductor integrated circuit 81 concretely disclosed in the above Japanese Laid-Open Publication.

In the semiconductor integrated circuit 81, a plurality of electrode pads 83 are provided in edge portions of the surface of a semiconductor chip 82. The surface of the semiconductor chip 82 is covered with a lower insulating film 84, except for portions where the electrode pads 83 are provided. A plurality of wires 85 are formed on the lower insulating film 84. One end of each of the wires 85 is connected to the electrode pad 83, and the other end has a connection pad. A component connection terminal 87 made of solder is formed on the connection pad. The wires 85 are covered with an upper insulating film 86, except for portions where the component connection terminals 87 are formed on the connection pads. A discrete electronic component 88 is connected between component connection terminals 87 of different wires 85.

In the semiconductor integrated circuit 81, an electronic component 88 is mounted on the surface of the semiconductor chip 82. The problem here is that the number of the electronic components 88 mounted is limited by an area of the semiconductor chip 82. Moreover, in case of CSP (Chip Size Package) which is the same in size as the semiconductor chip 82, an external connection terminal 89 is provided on the surface of the semiconductor chip 82. The problem here is that the electronic component 88 mounted is limited by an area of the semiconductor chip 82 and a height of the external connection terminal 89.

SUMMARY OF THE INVENTION

An object of the present invention is to provide a manufacturing method for a semiconductor integrated circuit, semiconductor integrated circuit, and semiconductor integrated circuit apparatus, in which mounting space on a printed-wiring board can be further reduced by mounting an electronic component on a semiconductor chip in advance, and in which one-packaged IC can be attained.

To achieve the above object, the manufacturing method for the semiconductor integrated circuit of the present invention includes the steps of (a) forming an insulating layer so that the insulating layer covers that surface of a semiconductor chip on which a plurality of connection electrodes are provided, but has apertures at portions corresponding to the connection electrodes; and (b) forming an electrical connection configuration in which electronic components are electrically connected with the plurality of connection electrodes, the electronic components being provided on an upper side of the semiconductor chip, the step (b) including forming a layer on the upper side of the semiconductor chip, the layer covering at least one of the electronic components.

Moreover, to achieve the above object, the semiconductor integrated circuit of the present invention includes: a semiconductor chip having a plurality of connection electrodes on a surface thereof; an insulating layer covering the surface of the semiconductor chip and having apertures at portions corresponding to the connection electrodes; a plurality of wires electrically connected with the connection electrodes; electronic components mounted on an upper side of the semiconductor chip, the electronic components being to be electrically connected with the connection electrodes through the wires; and a layer, on the upper side of the semiconductor chip, for covering at least one of the electronic components, in order to provide a structure for electrical connection configuration in which the at least one of the electronic components has electrical connection with the connection electrodes.

In the above manufacturing method, mounting space for the electronic component is expanded to the upper direction of the semiconductor chip during a wafer process of the semiconductor chip by forming a lamination above the electronic component. Moreover, in the above semiconductor integrated circuit, the mounting space for the electronic component is expanded to the upper direction of the semiconductor chip by forming the lamination above the electronic component.

Therefore, even where the mounting space in the in-plane direction of the semiconductor chip is limited, it is possible to increase the number of the electronic components to be mounted, by further mounting the electronic component above the lamination. As a result, it is possible to provide the manufacturing method for the semiconductor integrated circuit, in which the mounting space on the printed-wiring board can be further reduced by mounting the electronic component on the semiconductor chip in advance, and in which one-packaged IC can be attained.

Additional objects, features, and strengths of the present invention will be made clear by the description below. Further, the advantages of the present invention will be evident from the following explanation in reference to the drawings.

DESCRIPTION OF THE EMBODIMENTS

Figure 1:
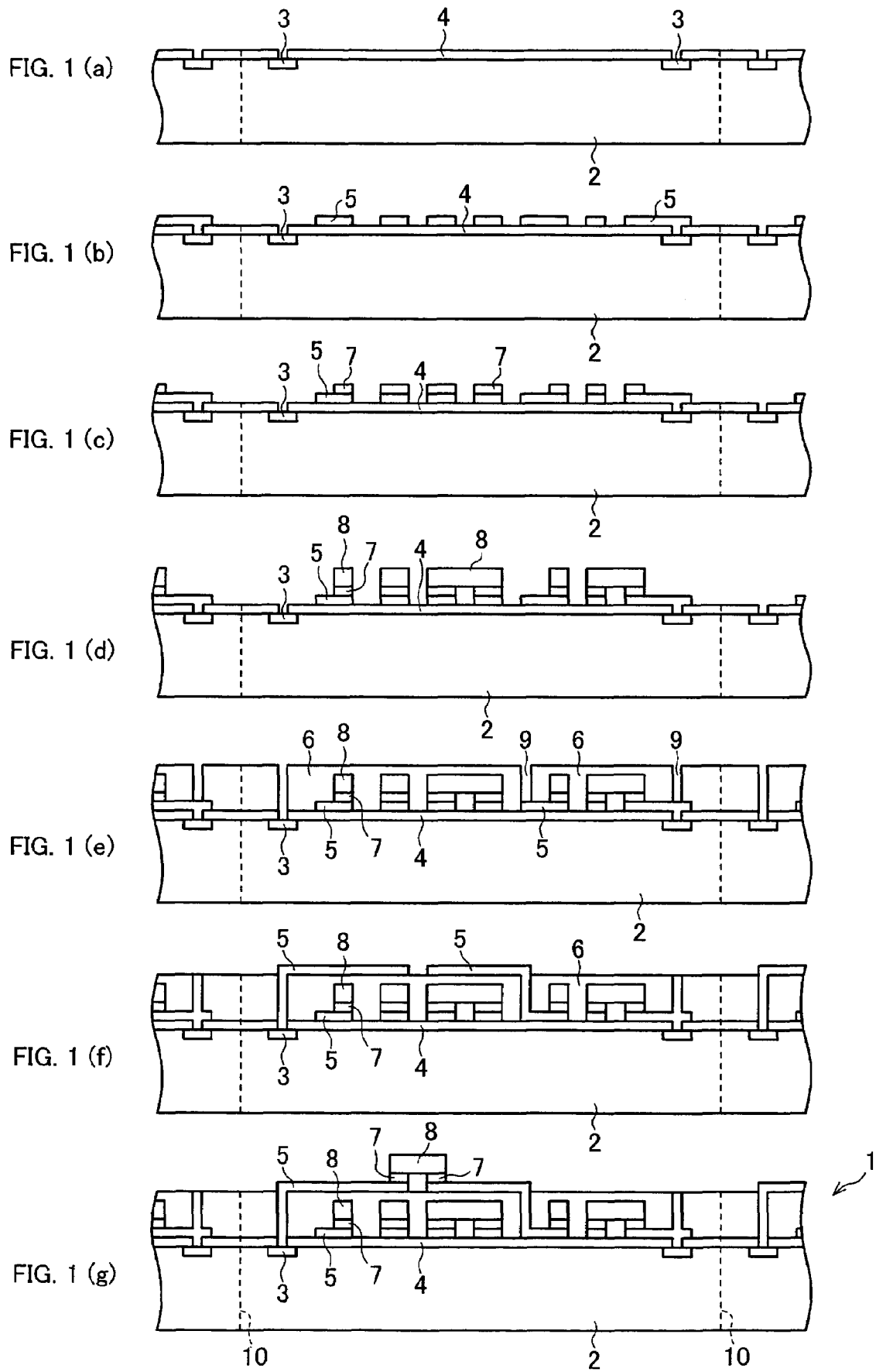
FIGS. 1(a) through 1(g) are cross sectional views illustrating a structure of a semiconductor integrated circuit and a manufacturing method thereof according to First Embodiment in the present invention.

The following description explains embodiments of the present invention with reference to FIGS. 1 through 9. It should be noted that the present invention is not limited thereto.

[First Embodiment]

FIGS. 1(a) through 1(g) are views illustrating a semiconductor integrated circuit 1 and its manufacturing method in First Embodiment of the present invention. A structure of the semiconductor integrated circuit 1 and its manufacturing method are explained with reference to the figures. Note that, in the following explanation on the semiconductor integrated circuit 1, wordings "upper", "above" and "upper side" indicate a direction which is vertical with respect to a surface of a semiconductor chip 2 and to which each layer is formed on the surface. (It should be noted that the word "upper side" does not mean "upper surface" of something here. That is, "an upper side of the something" is that side with respect to the something which is associated with the direction to which each layer is formed. For example, "A is formed on an upper side of the semiconductor chip 2" indicates that A is formed "on" and/or "above" the semiconductor chip 2.)

The semiconductor chip 2 illustrated in FIG. 1(a) is mainly made of silicon. In the semiconductor chip 2, an integrated circuit is formed. On the surface of the semiconductor chip 2, connection electrodes 3 to which metal wires will be connected via bonding are provided. First, a first insulating layer 4 made of polyimide is so formed on the surface of the semiconductor chip 2 as to cover the surface of the semiconductor chip 2, except for portions where the connection electrodes 3 are provided. An insulating film (not illustrated) of $SiO_2$, SiN, or the like is provided below the first insulating layer 4.

Next, wires 5 are formed on the first insulating layer 4 by plating as illustrated in FIG. 1(b). The wires 5 form a pattern by which electric conduction can be established between the connection electrode 3 and a portion where electronic component 8 (which will be described later) is to be mounted.

The wires 5 are formed by the following steps. First, on the connection electrodes 3 and the first insulating layer 4, that is, on the entire surface of the semiconductor chip 2, a film of titanium tungsten (TiW) and a film of copper (Cu) are formed sequentially by sputtering. Next, a photosensitive resist is formed on the copper. Exposure is carried out by using a mask so as to develop the photosensitive resist, thereby forming grooves (not illustrated) in which the wires 5 are to be formed. Then, copper is deposited in the grooves by electrolytic plating, and the photosensitive resist is chemically peeled off. By removing the sputtered films which are exposed on the surface and made of copper and titanium tungsten, the isolated copper wires 5 are formed. Next, on the copper wires 5, that is, on connection pads, a nickel (Ni) film is formed by non-electrolytic plating and a gold (Au) film is formed on the nickel film (not illustrated). In this way, the electronic component 8 can be mounted on the upper side of the semiconductor chip 2.

On the gold film, solder paste is printed to form component connection terminals 7 as illustrated in FIG. 1(c). A discrete electronic component 8 is placed on the component connection terminals 7 and fixed on the component connection terminals 7 by a reflow process as illustrated in FIG. 1(d).

Next, a second insulating layer 6 made of polyimide is so formed on the entire region of the surface of the semiconductor chip 2 as to cover the entire region of the surface of the semiconductor chip 2 as illustrated in FIG. 1(*e*). In this way, the second insulating layer 6 has the electronic component 8 built-in (the electronic component 8 is positioned under or within the second insulating layer 6 (the electronic component 8 is kept inside the second insulating layer)). Then, in order to enable electrical connection to the connection electrodes 3, and to the wires 5 on the first insulating layer 4 from the upper side of the second insulating layer 6, apertures 9 are made to the second insulating layer 6 by using a drill. Thus, the apertures 9 are made to the insulating layers including the first insulating layer 4 and the second insulating layer 6, which are layered on the upper side of the semiconductor chip 2.

Next, as illustrated in FIG. 1(*f*), gold wires (wires) are connected at portions where electrical connection is required, that is, from the upper side of the second insulating layer 6 to the connection electrodes 3 and to the wires 5 on the first insulating layer 4. The wires are cut on the second insulating layer 6. Then, wires 5, which are not the wires 5 on the first insulating layer 4, are formed by plating on the second insulating layer 6. (In the other word, the wires 5 on the first insulating layer 4 is extended to above the second insulting layer 6 by providing the gold wires and plating.) The wires 5 on the second insulating layer 6 form a pattern by which electrical conduction can be established between the connection electrode 3 and the electronic component 8 mounted on the upper side of the second insulating layer 6.

Next, on the copper wires 5, that is, on the connection pads, a nickel (Ni) film is formed by non-electrolytic plating and a gold (Au) film is formed on the nickel film (not illustrated). In this way, the electronic component 8 can be mounted on the upper side of the second insulating layer 6. Next, as illustrated in FIG. 1(*g*), solder paste is printed on the gold to form the component connection terminals 7. Then, the electronic component 8 is placed on the component connection terminals 7 and fixed on the component connection terminals 7 by a reflow process.

In addition, by further forming an insulating layer equivalent to the second insulating layer 6, a base for forming a third mounting layer is formed above a second mounting layer including the electronic component 8. An electronic component 8 is also mounted in the third mounting layer. In order to form electrical connection to the electronic component 8 in the third mounting layer, apertures are made to the insulating layer equivalent to the second insulating layer 6 of the second mounting layer and, if necessary, the apertures may continue into the second insulating layer 6 of a first mounting layer. Fourth, fifth and the like mounting layers are further formed in the same way.

After that, a back surface of the semiconductor chip 2 is polished to give the semiconductor integrated circuit 1 a size applicable to the following steps and mounting. In the last step, the semiconductor chip 2 is diced at dicing positions 10 to obtain the semiconductor integrated circuits 1.

Thus, in the present embodiment, the semiconductor chip 2 is diced after the electronic component 8 is mounted on the upper side of the semiconductor chip 2 fabricated still in a wafer form (wafer level). This process may be called a wafer level CSP (wafer level chip size package). In these steps, there are (i) the electronic component 8 mounted on the upper side of the first insulating layer 4 and covered by the second insulating layer 6, and (ii) the electronic component 8 mounted on the upper side of the second insulating layer 6. Together with the formation of the electrical connection configuration in which the wires 5 using the apertures 9 electrically connect the connection electrodes 3 with the electronic component 8 covered by the second insulating layer 6, the formation of the lamination is carried out, that is, the second insulating layer 6 is formed above the other electronic component 8 mounted on the upper side of the first insulating layer 4.

That is, in the present embodiment, mounting space is expanded to the upper direction of the semiconductor chip 2 during a wafer process of the semiconductor chip 2 in order to mount the electronic component 8 onto the semiconductor chip 2. Therefore, even where the mounting space in the in-plane direction of the semiconductor chip 2 is limited, it is possible to increase, as desired, a number of the mounting electronic components 8 by forming an arbitrary number of stacked structures in the upper direction. Therefore, unlike conventional semiconductor chips, the number of the electronic components 8 mounted on the semiconductor chip 2 is not limited by the area of the semiconductor chip 2 in the present embodiment.

As above, the formation of each electrical connection structure of the electronic component 8 of the semiconductor chip 2 is accompanied with the upward formation of at least one layer including the electronic component 8. In this way, the electronic component 8 is arranged on the upper side of the semiconductor chip 2 in advance before forming the electric structure. Thus, it is possible to further reduce the mounting space on the printed-wiring board. In addition, it is also possible to make it easy to attain one-packaged IC. Moreover, in this case, the lamination formed above the electronic component 8 indicates a lamination remained after the semiconductor integrated circuit 1 is produced.

Conventionally, there were no methods or arrangements for mounting the electronic component 8 on the semiconductor chip 2 and expanding the mounting space to the upper direction of the semiconductor chip 2 during the wafer process.

Figure 2:
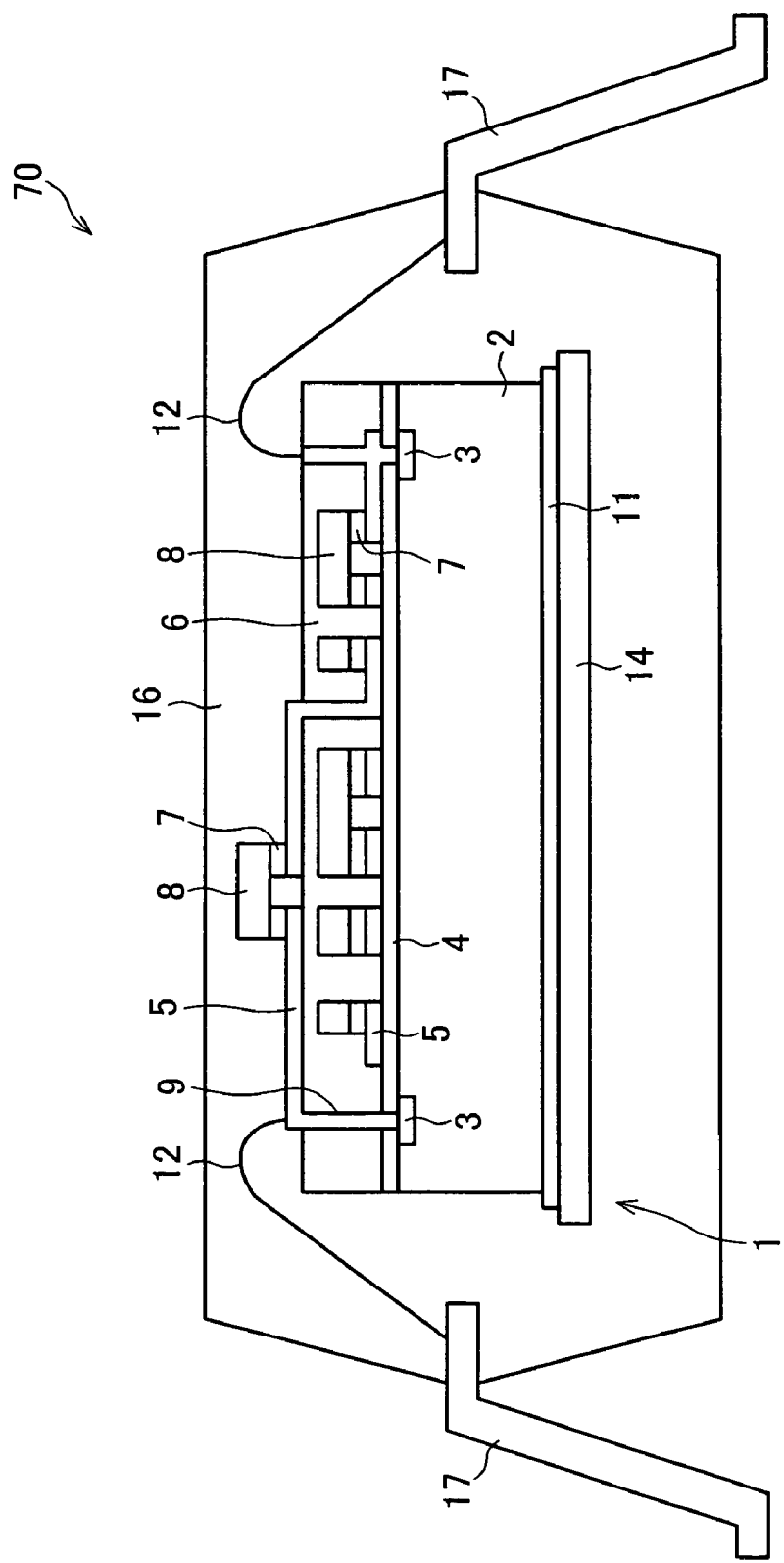
FIG. 2 is a cross sectional view illustrating a structure of a first semiconductor integrated circuit apparatus including the semiconductor integrated circuit of FIG. 1(g).
Figure 3:
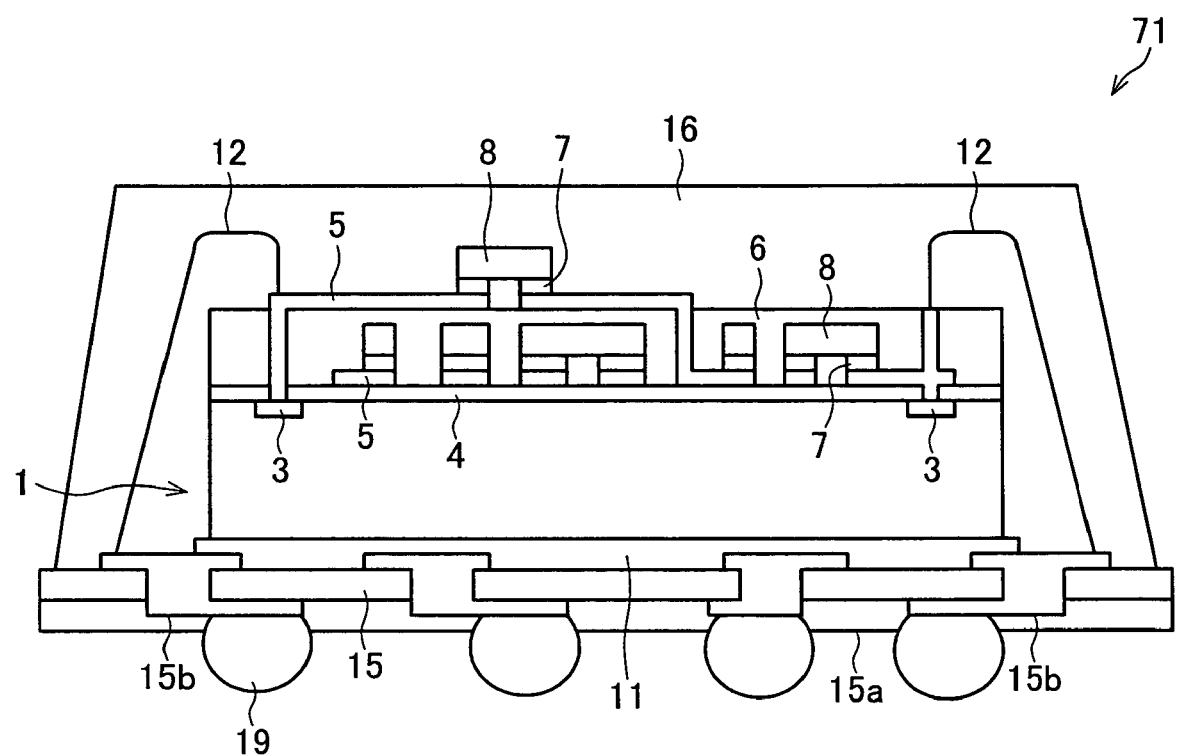
FIG. 3 is a cross sectional view illustrating a structure of a second semiconductor integrated circuit apparatus including the semiconductor integrated circuit of FIG. 1(g).
Figure 4:
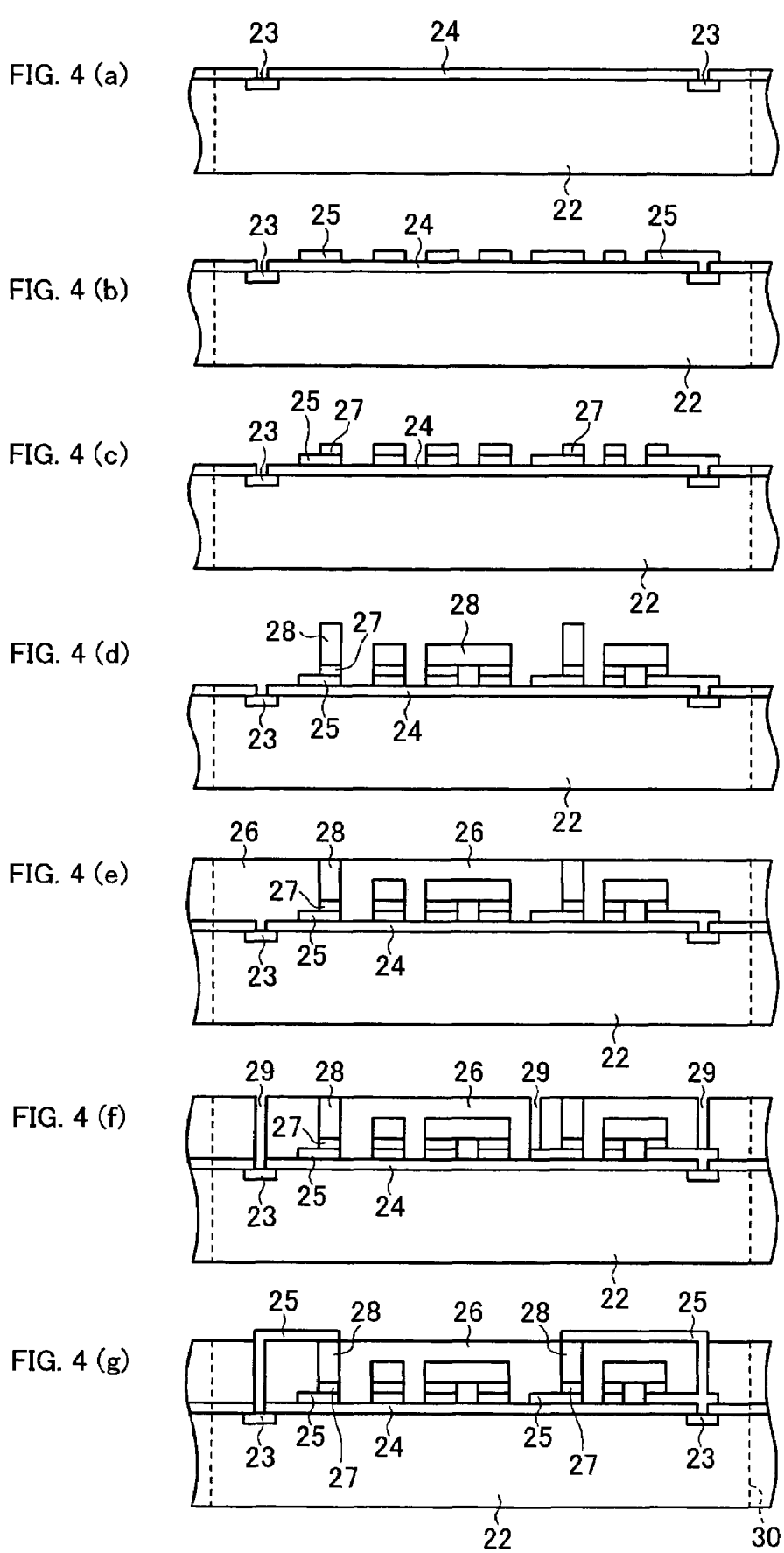
FIGS. 4(a) through 4(g) are cross sectional views illustrating a structure of a semiconductor integrated circuit and a manufacturing method thereof according to Second Embodiment in the present invention.

FIGS. 2 and 3 are cross sectional views illustrating a structure of a semiconductor integrated circuit apparatus prepared by packaging the semiconductor integrated circuit 1 produced by the above-mentioned manufacturing method. FIG. 2 illustrates an internal structure of a DIP type semiconductor package called TSOP (Thin Small Outline Package). FIG. 3 illustrates an internal structure of a BGA type semiconductor package called CSP. By resin-molding the semiconductor integrated circuit 1 produced by the above-mentioned manufacturing method, for example, a semiconductor package (semiconductor integrated circuit apparatus) 70 or a semiconductor package (semiconductor integrated circuit apparatus) 71 is formed. The semiconductor packages 70 and 71 are the same as conventional packages in terms of appearance.

In the semiconductor package 70 illustrated in FIG. 2, the semiconductor integrated circuit 1 on which the electronic component 8 is mounted is mounted such that the semiconductor chip 2 side of the semiconductor integrated circuit 1 is fixed, by using a die attach 11 (such as silver paste or the like), to a region called a die pad 14. The connection electrodes 3 and lead terminals 17 are electrically connected through wires 12. Moreover, the semiconductor integrated circuit 1, the die pad 14, and the wires 12 are wholly sealed with an epoxy resin 16. The lead terminals 17 are partially exposed to outside the package.

The semiconductor package 71 illustrated in FIG. 3 is almost the same in size as the semiconductor chip 2. In the semiconductor package 71, the semiconductor integrated circuit 1 on which the electronic component 8 is mounted is mounted such that the semiconductor chip 2 side of the semiconductor integrated circuit 1 is fixed, by using the die attach 11 (such as an insulating sheet of polyimide or the like), to one surface of a printed circuit board 15. The circuit substrate 15 includes an insulating portion 15a composed of an insulating substrate and a conductive portion 15b. The semiconductor integrated circuit 1 and the wires 12 are wholly sealed with the epoxy resin 16. The connection electrodes 3 and the conductive portions 15b are electrically connected through the wires 12. External connection terminals 19 electrically connected with the conductive portions 15b are formed on that other surface of the printed circuit board 15 on which the semiconductor chip 2 is not mounted.

[Second Embodiment]

FIGS. 4(a) through 4(g) are views illustrating a semiconductor integrated circuit 21 and its manufacturing method in Second Embodiment of the present invention. The following description explains a structure of the semiconductor integrated circuit 21 and the manufacturing method for the semiconductor integrated circuit 21 with reference to the figures.

The manufacturing method for the semiconductor integrated circuit 21 of the present embodiment is an improved version of the manufacturing method for the semiconductor integrated circuit 1 explained in First Embodiment. Note that, in the following explanation on the semiconductor integrated circuit 21, wordings "upper", "above", and "upper side" indicate a direction which is vertical with respect to a surface of a semiconductor chip 22 and to which each layer is formed on the surface. (It should be noted that the word "upper side" does not mean "upper surface" of something here. That is, "an upper side of the something" is that side with respect to the something which is associated with the direction to which each layer is formed. For example, "A is formed on an upper side of the semiconductor chip 22" indicates that A is formed "on" and/or "above" the semiconductor chip 22.)

The semiconductor chip 22 illustrated in FIG. 4(a) is mainly made of silicon. An integrated circuit is formed in the semiconductor chip 22. On the surface of the semiconductor chip 22, connection electrodes 23 to which metal wires will be connected via bonding are provided. First, a first insulating layer 24 made of polyimide is so formed on the surface of the semiconductor chip 22 as to cover the surface of the semiconductor chip 22, except for portions where the connection electrodes 23 are provided. An insulating film (not illustrated) of $SiO_2$, SiN, or the like is provided below the first insulating layer 24.

Next, wires 25 are formed by plating on the first insulating layer 24 as illustrated in FIG. 4(b). The wires 25 form a pattern by which electric conduction can be established between the connection electrode 23 and a portion where an electronic component 28 is to be mounted. The wires 25 are formed in the same way as First Embodiment. Next, on the copper wires 25, that is, on connection pads, a nickel (Ni) film is formed by non-electrolytic plating and a gold (Au) film is formed on the nickel film (not illustrated). In this way, a discrete electronic component 28 can be mounted.

On the gold film, solder paste is printed to form component connection terminals 27 as illustrated in FIG. 4(c). The electronic component 28 is placed on the component connection terminals 27 and fixed on the component connection terminals 27 by a reflow process as illustrated in FIG. 4(d). Moreover, there are problems of the wires 25, the area of the semiconductor chip 22, and the like. Due to the problems, only one end of the electronic component 28 is placed on the component connection terminals 27 and fixed on the component connection terminals 27 by the reflow process.

Next, a second insulating layer 26 made of polyimide is so formed on the entire surface of the semiconductor chip 22 as to cover the entire surface of the semiconductor chip 22 as illustrated in FIG. 4(e). In this way, the second insulating layer 26 has the electronic component 28 built-in (the electronic component 28 is positioned under or within the second insulating layer 26 (the electronic component 28 is kept inside the second insulating layer 26)). Then, as illustrated in FIG. 4(f), apertures 29 are made to the second insulating layer 26 by using a drill in order to expose the connection electrodes 23 on the second insulating layer 26. Thus, the apertures 29 are made to the insulating layers including the first insulating layer 24 and the second insulating layer 26, which are layered on the upper side of the semiconductor chip 22.

Next, as illustrated in FIG. 4(g), gold wires (wires) are connected with the connection electrodes 23 and cut on the second insulating layer 26. Wires 25, which are not the wires 25 on the first insulating layer 24, are formed by plating on the second insulating layer 26. (In other words, the wires 25 on the first insulating layer 24 is extended to above the second insulating layer 26 by providing the gold wires and plating.) Moreover, a base for forming a second mounting layer above a first mounting layer including the electronic component 28 is formed in the above steps. The electronic component 28 is also mounted to the second mounting layer. In order to form electrical connection to the electronic component 28 in the second mounting layer, apertures are made to the second insulating layer 26 in the first mounting layer. Third, fourth, and the like mounting layers are formed in the same way. After that, a back surface of the semiconductor chip 22 is polished to give the semiconductor integrated circuit 21 a size applicable to the following steps and mounting. In the last step, the semiconductor chip 2 is diced at dicing positions 30.

Thus, in the present embodiment, the semiconductor chip 22 is diced after the electronic component 28 is mounted on the upper side of the semiconductor chip 22 fabricated still in a wafer form. This process may be called a wafer level CSP. In these steps, there are (i) the electronic component 28 mounted on the upper side of the first insulating layer 24 and covered with the second insulating layer 26, and (ii) the electronic component 28 arranged vertically to the surface of the semiconductor chip 22. That is, the longitudinal direction of the electronic component 28 is vertical with respect to the surface of the semiconductor chip 22. Together with the formation of the electrical connection structure in which the wires 25 using the apertures 29 electrically connect the connection electrodes 23 with the electronic component 28 arranged vertically, the wire 25 is formed above the electronic component 28.

That is, in the present embodiment, mounting space is expanded to the upper direction of the semiconductor chip 22 during a wafer process of the semiconductor chip 22 in order to mount the electronic component 28 onto the semiconductor chip 22. The electronic component 28 arranged vertically (that is, in a standing state) is mounted and a wire for electrical conduction is connected from above the electronic component 28. In this way, the single electronic component 28 occupies a smaller in-plane area on the semiconductor chip 22 by being arranged vertically to the semiconductor chip 22, that is, the configuration is expanded in the upper direction (i.e. the electronic component 28 is arranged vertically to the surface of the semiconductor chip 22, and/or mounting space is expanded to the upper direction of the semiconductor chip 22). Therefore, even where the mounting space in the in-plane direction of the semiconductor chip 22 is limited, it is possible to increase the number of the mounting electronic components 28 by mounting the electronic component vertically to the semiconductor chip 22. Therefore, unlike conventional semiconductor chips, the number of the electronic components 28 mounted on the semiconductor chip 22 is not limited by the area of the semiconductor chip.

As above, in order to form electrical connection to each electronic component 28 of the semiconductor chip 22, it is necessary to form at least one lamination above the electronic component 28. In this way, the electronic component 28 is arranged on the upper side of the semiconductor chip 22 in advance before forming the electric structure. Thus, it is possible to further reduce the mounting space on the printed-wiring board. In addition, it is also possible to make it easy to attain one-packaged IC. Moreover, in this case, the lamination formed above the electronic component 28 indicates a lamination remained after the semiconductor integrated circuit 21 is produced.

Conventionally, there were no methods or arrangements for mounting the electronic component 28 on the semiconductor chip 22 and expanding the mounting space to the upper direction of the semiconductor chip 22 during the wafer process.

Figure 5:
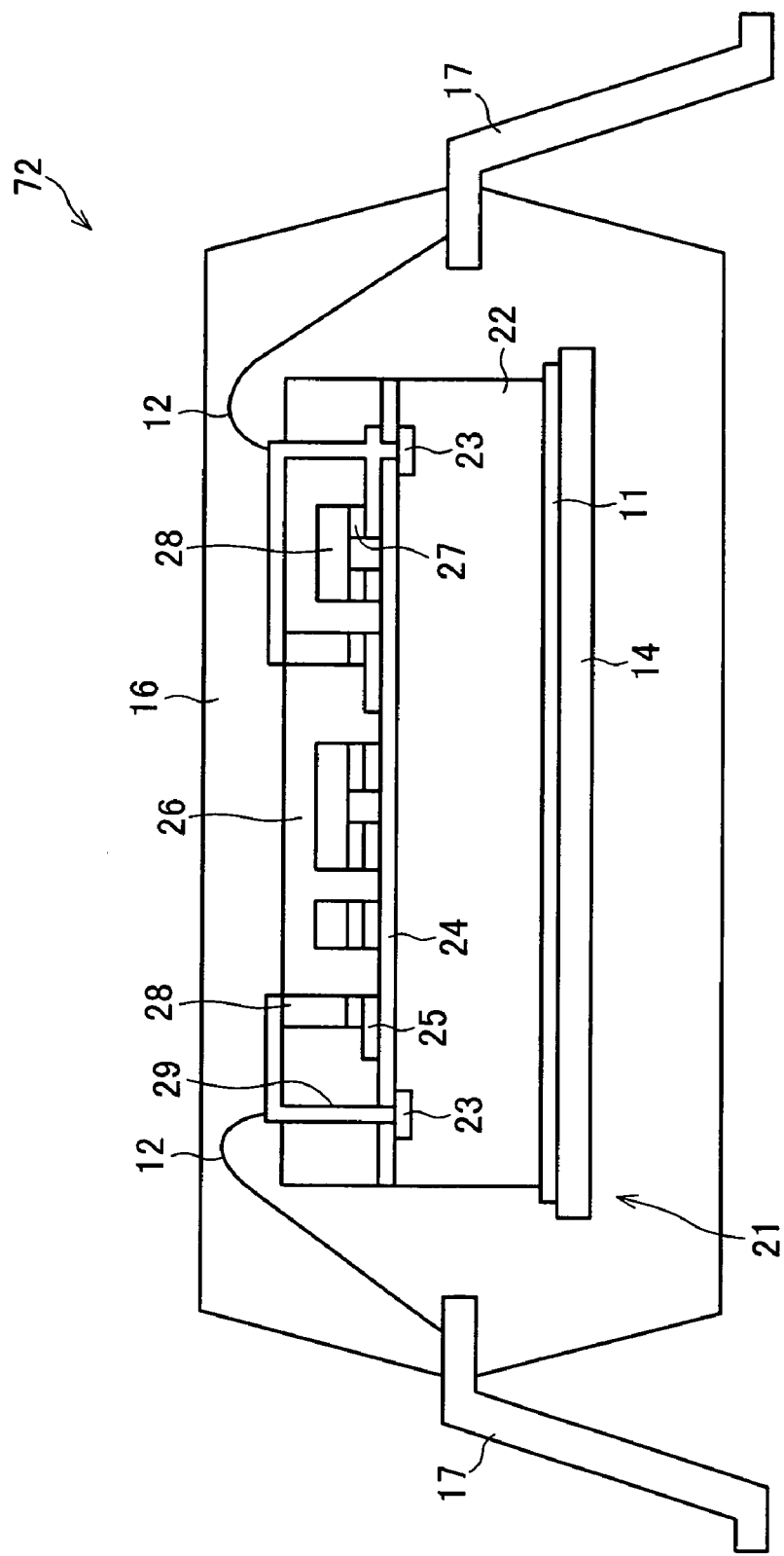
FIG. 5 is a cross sectional view illustrating a structure of the first semiconductor integrated circuit apparatus including the semiconductor integrated circuit of FIG. 4(g).
Figure 6:
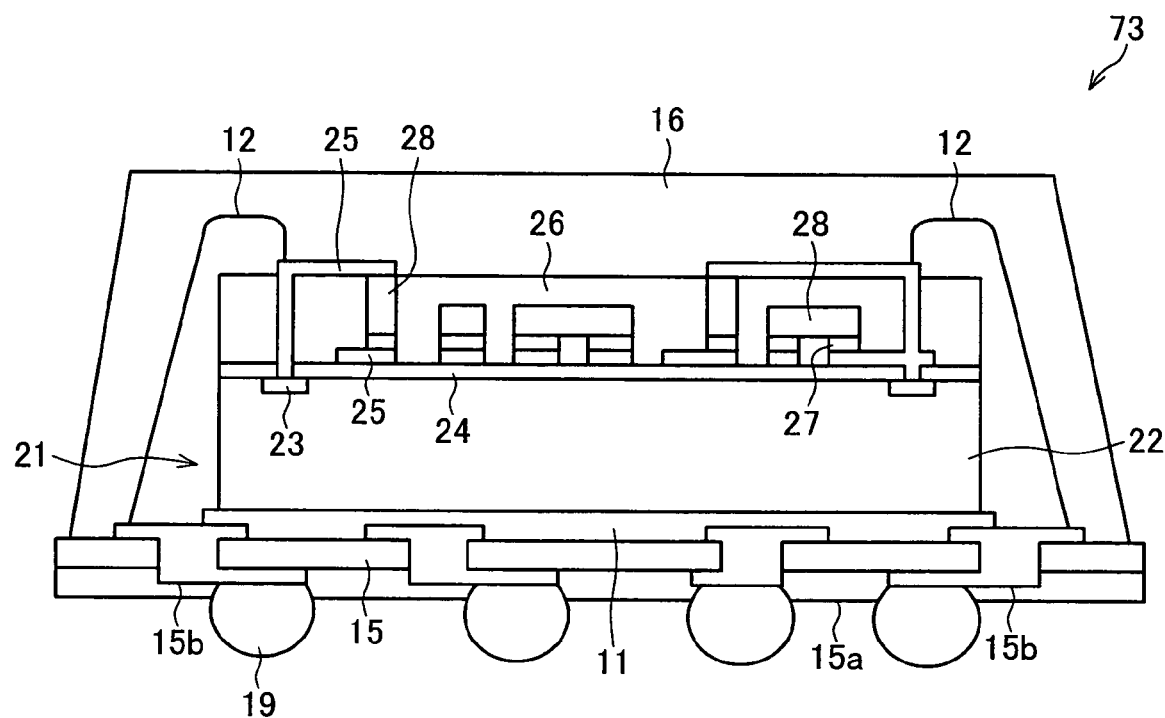
FIG. 6 is a cross sectional view illustrating a structure of the second semiconductor integrated circuit apparatus including the semiconductor integrated circuit of FIG. 4(g).
Figure 7:
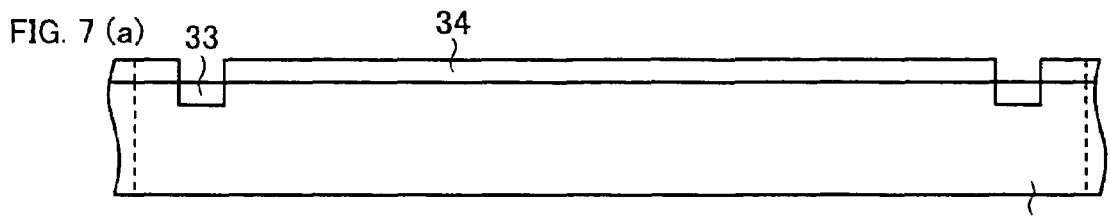
FIGS. 7(a) through 7(e) are cross sectional views illustrating a structure of a semiconductor integrated circuit and a manufacturing method thereof according to Third Embodiment in the present invention.
Figure 7:
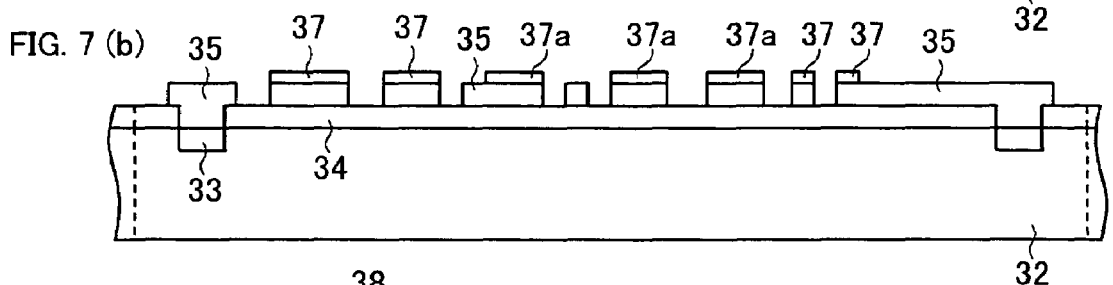
Figure 7:
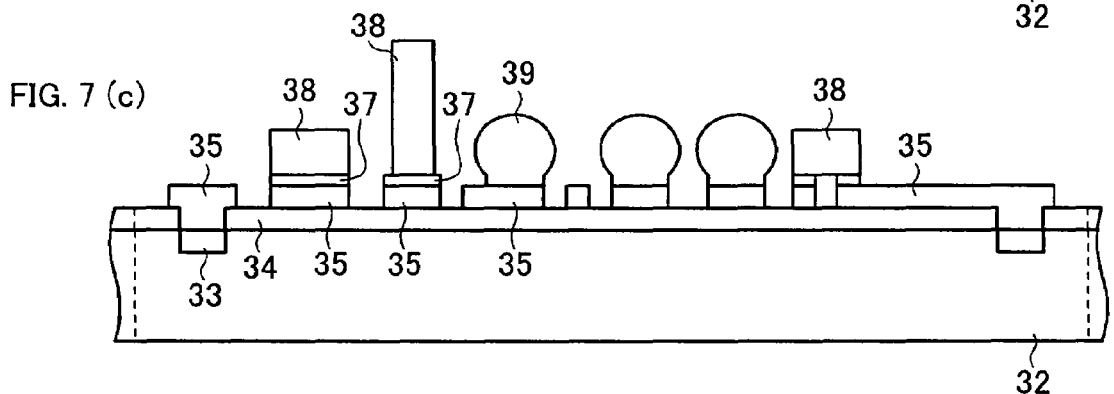
Figure 7:
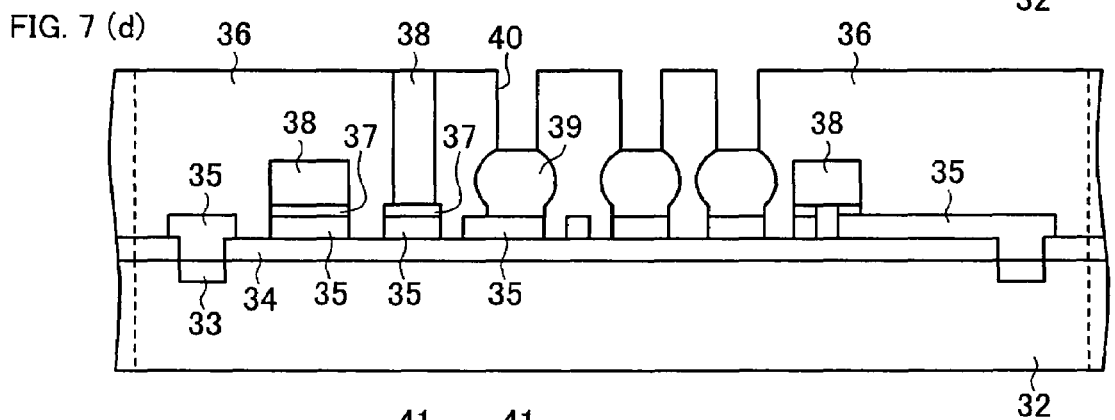
Figure 7:
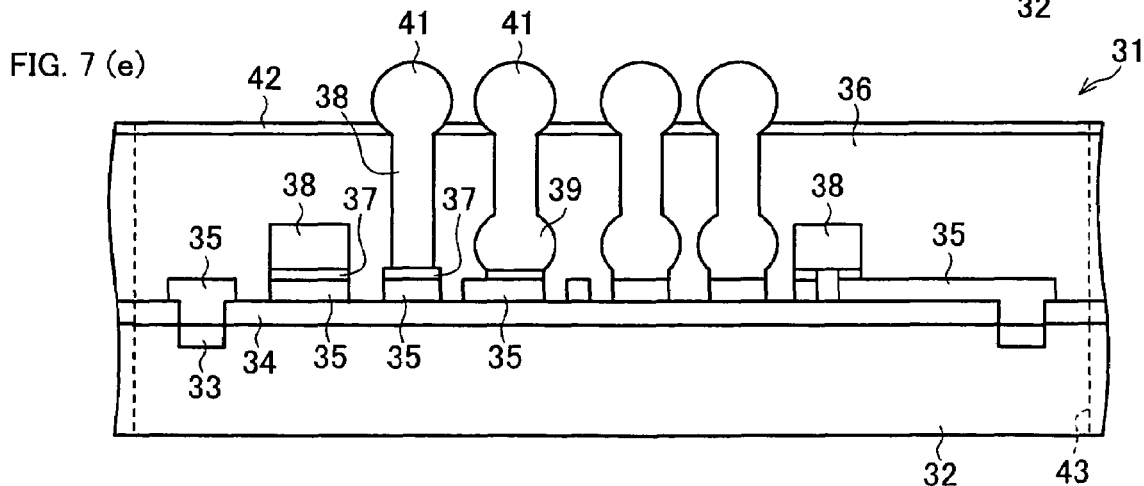

FIGS. 5 and 6 are cross sectional views illustrating that the semiconductor integrated circuit 21 produced by the above-mentioned manufacturing method is packaged. FIG. 5 illustrates an internal structure of a DIP type semiconductor package 72 called TSOP. FIG. 6 illustrates an internal structure of a BGA type semiconductor package 73 called CSP. By resin-molding the semiconductor integrated circuit 21 produced by the above-mentioned manufacturing method, for example, the semiconductor package 72 or the semiconductor package 73 is formed. The semiconductor packages 72 and 73 are the same as conventional packages in terms of appearance.

In the semiconductor package 72 illustrated in FIG. 5, the semiconductor integrated circuit 21 on which the electronic component 28 is mounted is mounted such that the semiconductor chip 22 side of the semiconductor integrated circuit 21 is fixed, by using a die attach 11 (such as silver paste or the like), to a region called a die pad 14. The connection electrodes 23 and lead terminals 17 are electrically connected through wires 12. Moreover, the semiconductor integrated circuit 21, the die pad 14, and the wires 12 are wholly sealed with an epoxy resin 16. The lead terminals 17 is partially exposed to outside the package.

The semiconductor package 73 illustrated in FIG. 6 is almost the same in size as the semiconductor chip 22. In the semiconductor package 73, the semiconductor integrated circuit 21 on which the electronic component 28 is mounted is mounted such that the semiconductor chip 22 side of the semiconductor integrated circuit 21 is fixed, with the die attach 11 (such as an insulating sheet of polyimide or the like), to one surface of a printed circuit board 15. The printed circuit board 15 includes an insulating portion 15a composed of an insulating substrate and a conductive portion 15b. The semiconductor integrated circuit 21 and the wires 12 are wholly sealed with the epoxy resin 16. The connection electrodes 23 and the conductive portions 15b are electrically connected through the wires 12. External connection terminals 19 electrically connected with the conductive portions 15b are formed on the other surface of the printed circuit board 15 (the semiconductor chip 22 is not mounted on the other surface).

[Third Embodiment]

FIGS. 7(a) through 7(e) are views illustrating a semiconductor integrated circuit 31 and its manufacturing method in Third Embodiment of the present invention. The following description explains a structure of the semiconductor integrated circuit 31 and the manufacturing method for the semiconductor integrated circuit 31 with reference to the figures.

The manufacturing method for the semiconductor integrated circuit 31 of the present embodiment is an improved version of the manufacturing method for the semiconductor integrated circuit 1 explained in First Embodiment. Note that, in the following explanation on the semiconductor integrated circuit 31, wordings "upper", "above", and "upper side" indicate a direction which is vertical with respect to a surface of a semiconductor chip 32 and to which each layer is formed on the surface. (It should be noted that the word "upper side" does not mean "upper surface" of something here. That is, "an upper side of the something" is that side with respect to the something which is associated with the direction to which each layer is formed. For example, "A is formed on an upper side of the semiconductor chip 32" indicates that A is formed "on" and/or "above" the semiconductor chip 32.)

The semiconductor chip 32 is mainly made of silicon. An integrated circuit is formed in the semiconductor chip 32. On the surface of the semiconductor chip 32, connection electrodes 33 to which metal wires will be connected via bonding are provided. First, as illustrated in FIG. 7(a), the surface of the semiconductor chip 32 is covered with a first insulating layer 34, like First Embodiment. Next, as illustrated in FIG. 7(b), wires 35 are formed on the first insulating layer 34. Next, solder paste is printed at connection pads and electrode pads for external-connection-terminal connection. In this way, component connection terminals 37 (portions corresponding to connection pads) for mounting an electronic component 38 and connection portions 37a (portions corresponding to electrode pads for external-connection-terminal connection) for forming the external connection terminals are formed.

Next, as illustrated in FIG. 7(c), a discrete electronic component 38 is mounted on the component connection terminals 37 and a solder ball is mounted on the connection portion 37a. A reflow process is carried out to fix the electronic component 38 on the component connection terminals 37, and to form external connection terminals 39 made of first solder bumps on the connection portions 37a. As above, the external connection terminals 39 and the electronic component 38 are attached at the same time. Top of some electronic components 38 is located higher than that of other components (including other electronic components 38) because, when mounted, they are arranged vertically to the surface of the semiconductor chip 32.

Next, as illustrated in FIG. 7(d), the entire region of the surface of the semiconductor chip 32 including the external connection terminals 39 is covered with a second insulating layer 36. The second insulating layer 36 is set to be at the same level in height as the highest top of the electronic components 38. In this way, the second insulating layer 36 has the electronic component 38 built-in (the electronic component 38 is positioned under or within the second insulating layer 36 (the electronic component 38 is kept inside the second insulating layer 36)). Then, apertures 40 are made to the second insulating layer 36 by using a drill in order to expose the external connection terminals 39. Thus, the apertures 40 are made to the insulating layers including the first insulating layer 34 and the second insulating layer 36, which are layered on the upper side of the semiconductor chip 32.

Next, as illustrated in FIG. 7(e), another external connection terminal 41 made of a second solder bump is formed so that the external connection terminal 41 is electrically connected with the external connection terminal 39 through the gold wires (wires) formed on the second insulating layer 36. The second insulating layer 36 is covered with a third insulating layer 42, except for portions where the external connection terminals 41 are provided. Moreover, a base for forming a second mounting layer above a first mounting layer including the electronic component 38 is formed in the above steps. The electronic component 38 is mounted also in the second mounting layer. In order to form electrical connection to the electronic component 38 in the second mounting layer, apertures are made to the second insulating layer 36 in the first mounting layer. Third, fourth, and the like mounting layers are further formed in the same way. After that, a back surface of the semiconductor chip 32 is polished to give the semiconductor integrated circuit 31 a size applicable to the following steps and mounting. In the last step, the semiconductor chip 32 is diced at dicing positions 43.

Thus, in the present embodiment, the semiconductor chip 32 is diced after the electronic component 38 is mounted and the external connection terminals 39 and 41 are formed on the upper side of the semiconductor chip 32 fabricated still in a wafer form. This process may be called a wafer level CSP. In these steps, there are some electronic components 38 which are mounted on the upper side of the first insulating layer 34 and are high (its top is located high). In order to form electrical connection to the electronic component 38, the external connection terminal 41 needs to be formed above the electronic component 38.

That is, in the present embodiment, mounting space is expanded to the upper direction of the semiconductor chip 32 during a wafer process of the semiconductor chip 32 in order to mount the electronic component 38 onto the semiconductor chip 32. By doing this, the gold wires between the external connection terminals 39 and 41 are extended according to the height of the electronic component 38 to be mounted. Therefore, even where the mounting space in the in-plane direction of the semiconductor chip 32 is limited, it is possible to increase the number of the electronic components 38 to be mounted. Unlike conventional semiconductor chips, the electronic component 38 applicable to the semiconductor chip 32 is not limited by the area of the semiconductor chip or the height of the external connection terminal. Moreover, another external connection terminal may be additionally formed to the external connection terminal 39 by a structure of vertically stacking three or more solder bumps (that is, the another external connection terminal may be provided to the external connection terminal 39, so that a structure in which three or more solder bumps stacked vertically is formed with the another external connection terminal and the external connection terminal 39).

Figure 11:
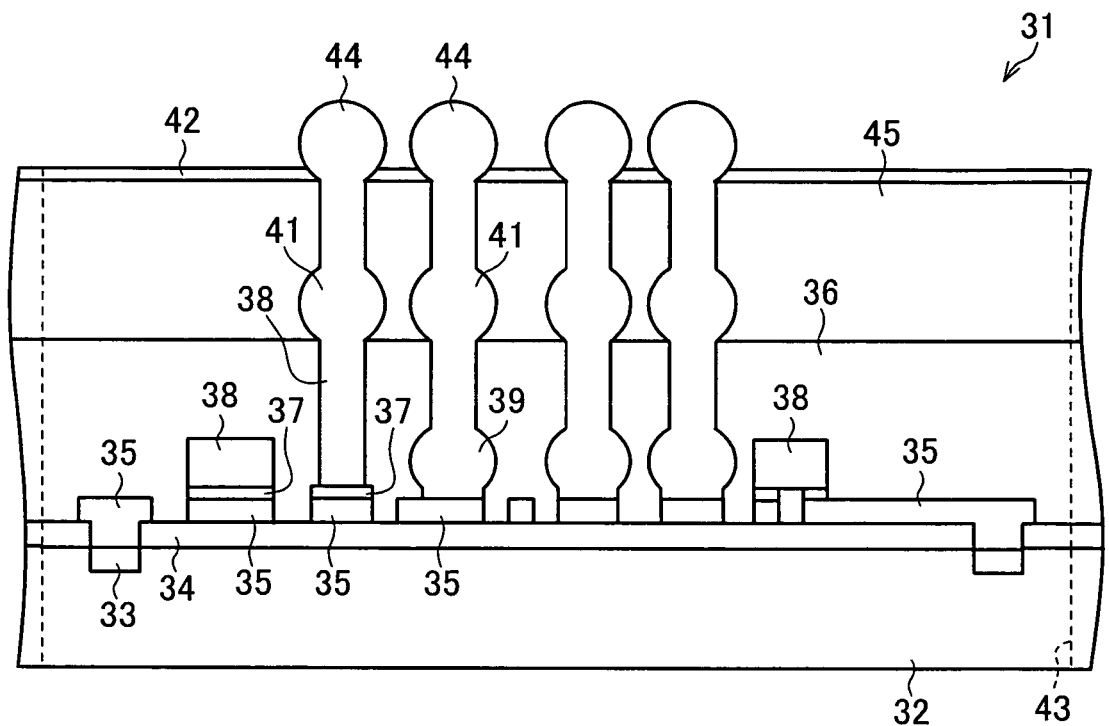
FIG. 11 is a cross sectional view illustrating another structure of the semiconductor integrated circuit according to Third Embodiment.

FIG. 11 illustrates a structure in which three solder bumps are stacked vertically. According to the structure, an insulating layer 45 is further layered on the second insulating layer 36, and is covered with an insulating layer 42. Moreover, the insulating layer 45 is so layered that an external connection terminal 44 is provided as another external connection terminal. In case of a structure (not illustrated) in which four or more solder bumps are stacked vertically, an insulating layer(s) is(are) additionally layered as required by the number of the external connection terminals.

As above, in order to form electrical connection to each electronic component 38 of the semiconductor chip 32, it is necessary to form at least one lamination (layer) above the electronic component 38. In this way, the electronic component 38 is arranged on the upper side of the semiconductor chip in advance before forming the electric structure. Thus, it is possible to further reduce the mounting space on the printed-wiring board. In addition, it is also possible to make it easy to attain one-packaged IC. Moreover, in this case, the lamination formed above the electronic component 38 indicates a lamination remained after the semiconductor integrated circuit is produced.

Conventionally, there were no methods or arrangements for mounting the electronic component on the semiconductor chip and expanding the mounting space to the upper direction of the semiconductor chip during the wafer process.

[Fourth Embodiment]

Figure 8:
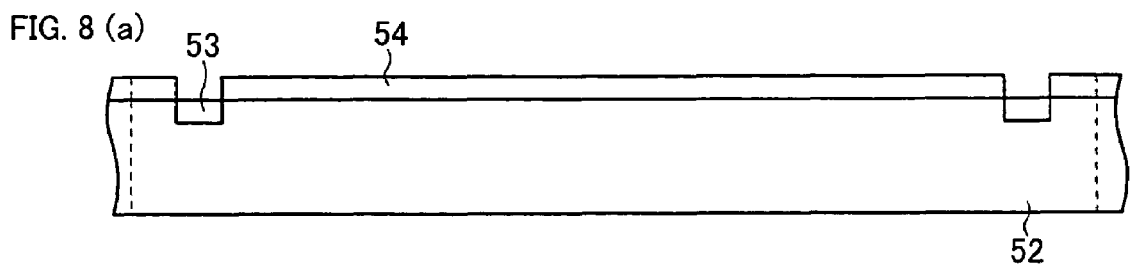
FIGS. 8(a) through 8(e) are cross sectional views illustrating a structure of a semiconductor integrated circuit and a manufacturing method thereof according to Fourth Embodiment in the present invention.
Figure 8:
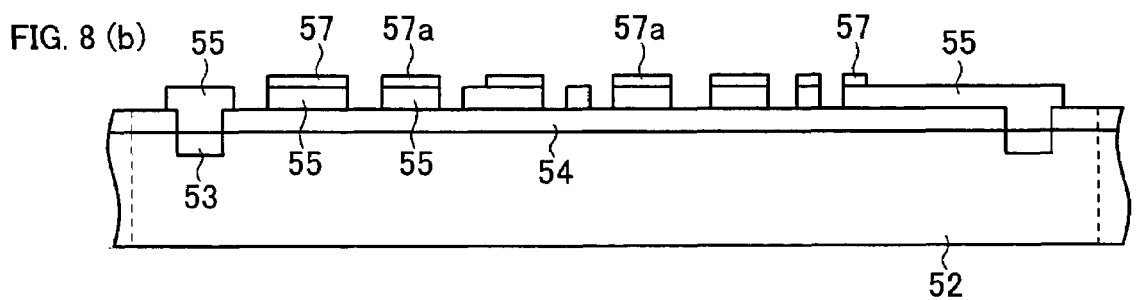
Figure 8:
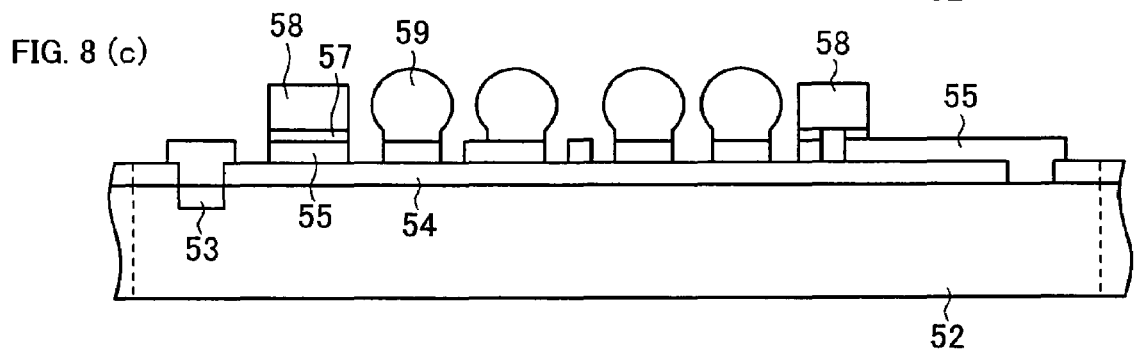
Figure 8:
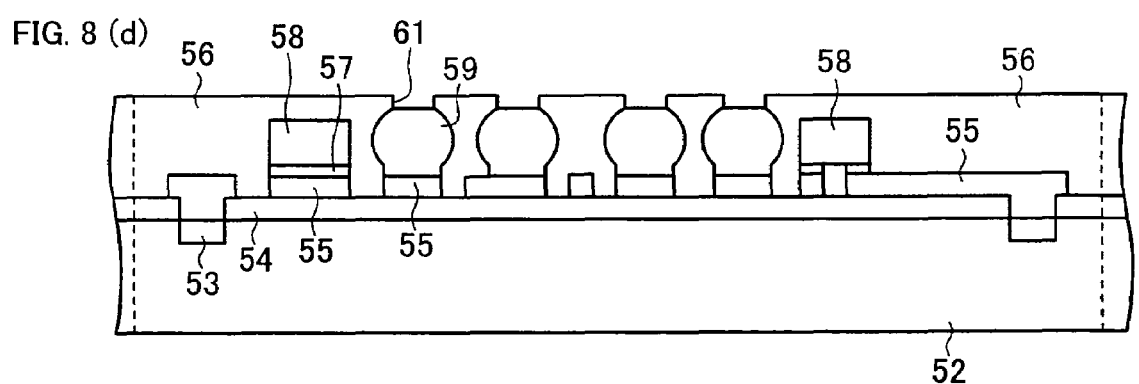
Figure 8:
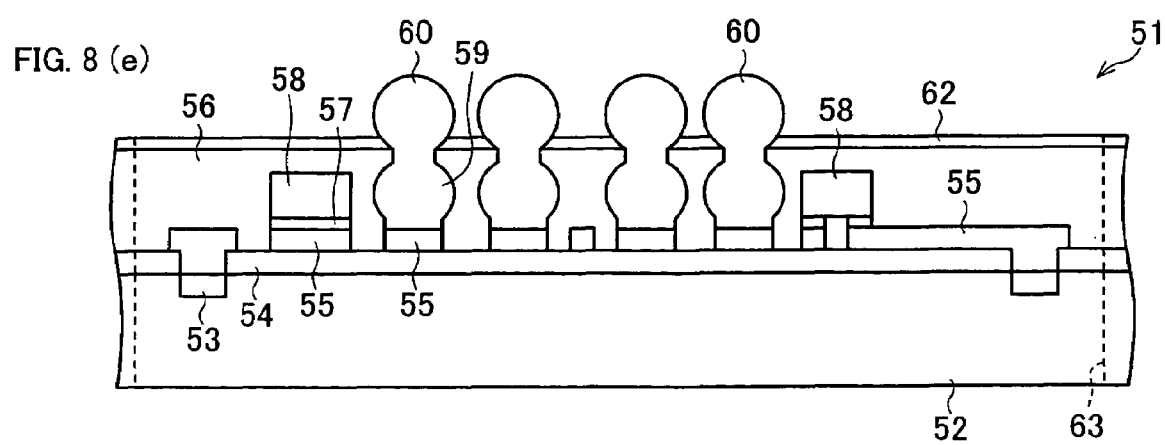
Figure 9:
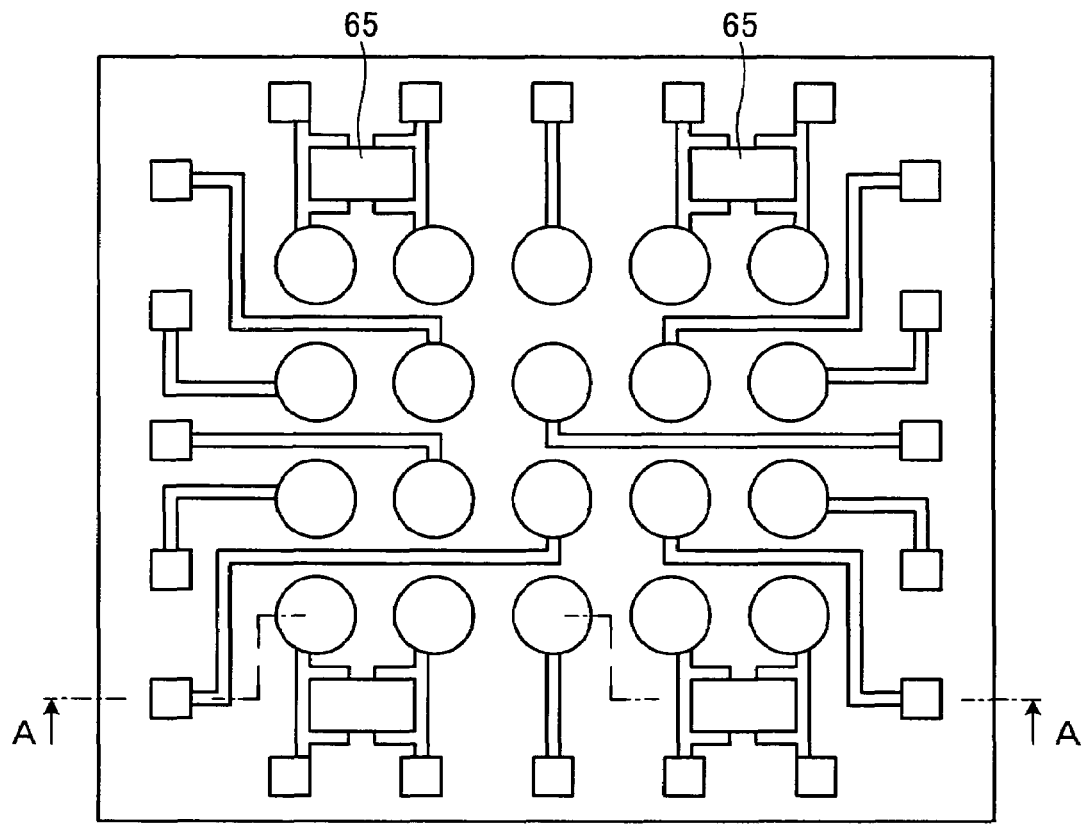
FIG. 9(a) is a plan view illustrating a structure of a semiconductor integrated circuit according to Fifth Embodiment in the present invention.
FIG. 9(b) is a cross sectional view taken on line A—A of FIG. 9(a).
Figure 9:
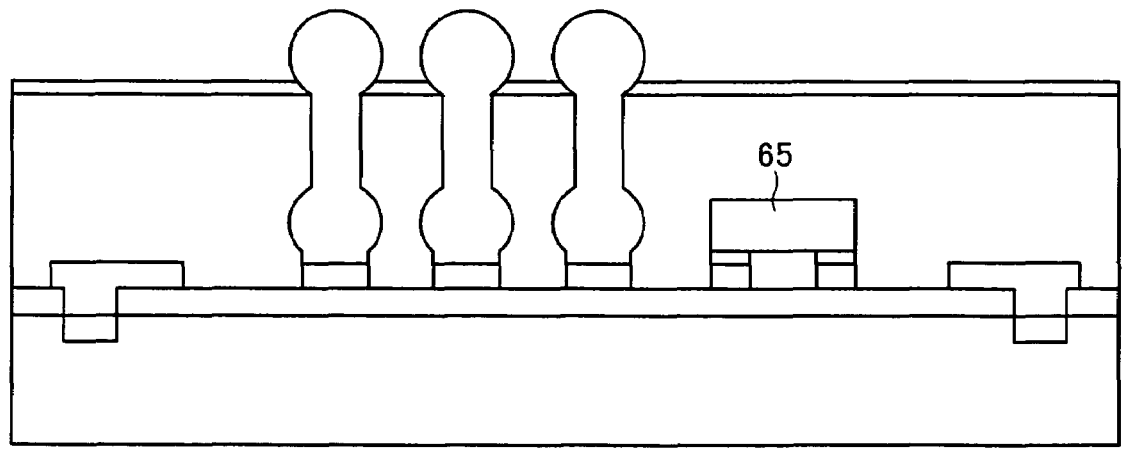
Figure 10:
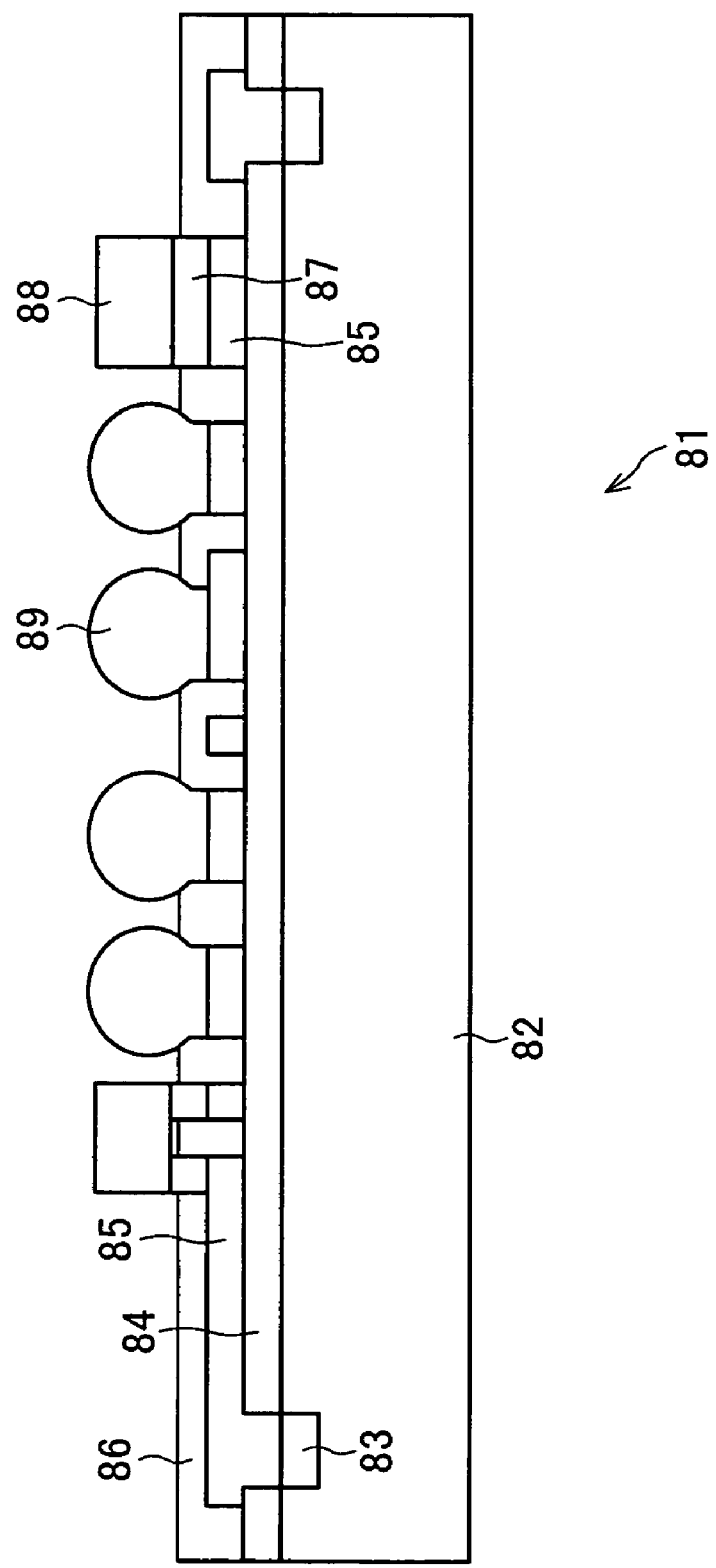
FIG. 10 is a cross sectional view illustrating a structure of a conventional semiconductor integrated circuit.

FIGS. 8(*a*) through 8(*e*) are views illustrating a semiconductor integrated circuit 51 and its manufacturing method in Fourth Embodiment of the present invention. The following description explains a structure of the semiconductor integrated circuit 51 and the manufacturing method for the semiconductor integrated circuit 51 with reference to the figures.

The manufacturing method for the semiconductor integrated circuit 51 of the present embodiment is an improved version of the manufacturing method for the semiconductor integrated circuit 1 explained in First Embodiment. Note that, in the following explanation on the semiconductor integrated circuit 51, wordings "upper", "above", and "upper side" indicate a direction which is vertical with respect to a surface of a semiconductor chip 52 and to which each layer is formed on the surface. (It should be noted that the word "upper side" does not mean "upper surface" of something here. That is, "an upper side of the something" is that side with respect to the something which is associated with the direction to which each layer is formed. For example, "A is formed on an upper side of the semiconductor chip 52" indicates that A is formed "on" and/or "above" the semiconductor chip 52.)

The semiconductor chip 52 is mainly made of silicon. An integrated circuit is formed in the semiconductor chip 52. On the surface of the semiconductor chip 52, connection electrodes 53 to which metal wires will be connected via bonding are provided. First, as illustrated in FIG. 8(*a*), the surface of the semiconductor chip 52 is covered with a first insulating layer 54, like First Embodiment. Next, as illustrated in FIG. 8(*b*), wires 55 are formed on the first insulating layer 54. Next, solder paste is printed at connection pads and electrode pads for external-connection-terminal connection. In this way, component connection terminals 57 (portions corresponding to connection pads) for mounting a discrete electronic component 58 and connection portion 57*a* (portions corresponding to electrode pads for external-connection-terminal connection) for forming external connection terminals are formed.

Next, as illustrated in FIG. 8(*c*), the electronic component 58 is mounted on the component connection terminals 57 and a solder ball is mounted on the connection portion 57*a*. A reflow process is carried out to fix the electronic component 58 on the component connection terminals 57, and to form external connection terminal 59 made of a first solder bump on the connection portion 57*a*. As above, the external connection terminal 59 and the electronic component 58 are attached at the same time.

Next, as illustrated in FIG. 8(*d*), a second insulating layer 56 is so formed on the entire region of the surface of the semiconductor chip 52 including the external connection terminals 59 as to cover the entire region of the surface of the semiconductor chip 52. In this way, the second insulating layer 56 has the electronic component 58 built-in (the electronic component 58 is positioned under or within the second insulating layer 56 (the electronic component 58 is kept inside the second insulating layer 56)). Then, apertures 61 are made to the second insulating layer 56 by using a drill in order to expose the external connection terminals 59 on the upper side of the second insulating layer 56. Thus, the apertures 61 are made to the insulating layers including the first insulating layer 54 and the second insulating layer 56, which are layered on the upper side of the semiconductor chip 52.

Next, as illustrated in FIG. 8(e), a solder ball is mounted on the external connection terminal 59. A reflow process is carried out to form other external connection terminal 60 which is electrically connected with the external connection terminal 59 and is made of a second solder bump. The second insulating layer 56 is covered with a third insulating layer 62, except for portions where the external connection terminals 60 are provided.

A base for forming a second mounting layer above a first mounting layer including the electronic component 58 is formed in the above steps. An electronic component 58 is mounted also in the second mounting layer. In order to form electrical connection to the electronic component 58 in the second mounting layer, apertures are made to the second insulating layer 56 in the first mounting layer. Third, fourth, and the like mounting layers are further formed in the same way. After that, a back surface of the semiconductor chip 52 is polished to give the semiconductor integrated circuit 51 a size applicable to the following steps and mounting. In the last step, the semiconductor chip 52 is diced at dicing positions 63.

Thus, in the present embodiment, the semiconductor chip 52 is diced after the electronic component 58 is mounted and the external connection terminals 59 and 60 are formed on the upper side of the semiconductor chip 52 fabricated still in a wafer form. This process may be called a wafer level CSP. In these steps, in order to form electrical connection to the electronic component 58 mounted in the second or above mounting layer, an insulating layer corresponding to the second insulating layer 56 needs to be formed above the electronic component 58 mounted in a mounting layer lower than the mounting layer including the electronic component 58 to be electrically connected.

That is, in the present embodiment, mounting space is expanded to the upper direction of the semiconductor chip 52 during a wafer process of the semiconductor chip 52 in order to mount the electronic component 58 onto the semiconductor chip 52. The size of the external connection terminals 59 is adjusted according to the height of the electronic component 58 to be mounted. Therefore, even where the mounting space in the in-plane direction of the semiconductor chip 52 is limited, it is possible to increase the number of the electronic components 58 to be mounted. Unlike conventional semiconductor chips, the electronic component 58 applicable to the semiconductor chip 52 is not limited by the area of the semiconductor chip or the height of the external connection terminal.

Moreover, another external connection terminal may be additionally formed to the external connection terminal 59 by a structure of vertically stacking three or more solder bumps. (That is, the another external connection terminal may be provided to the external connection terminal 59, so that a structure in which three or more solder bumps stacked vertically is formed with the another external connection terminal and the external connection terminal 59.)

Figure 12:
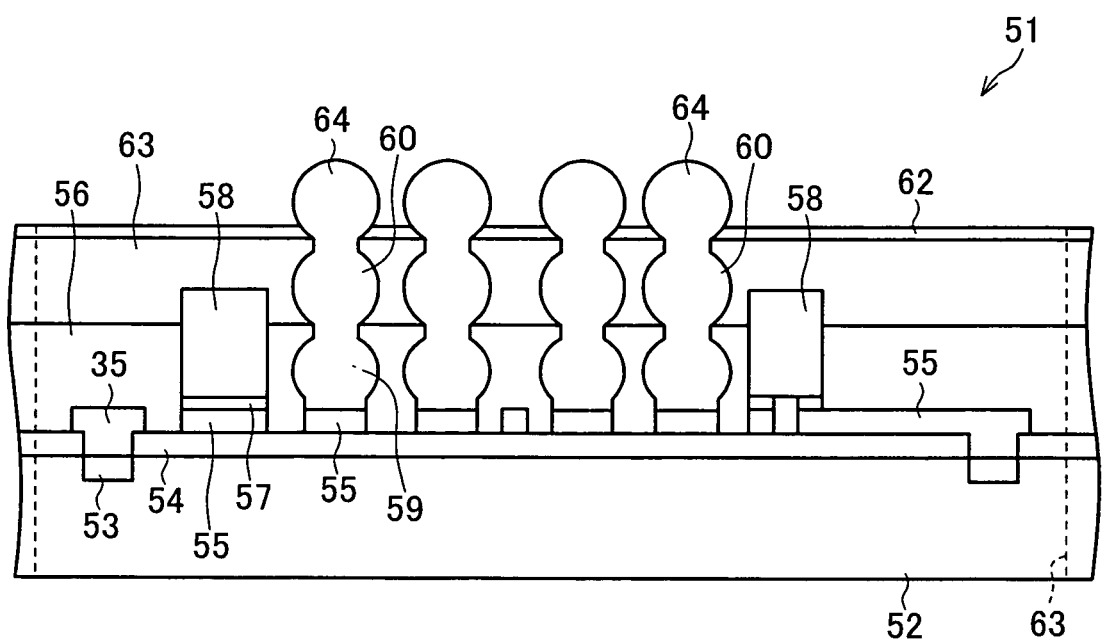
FIG. 12 a cross sectional view illustrating another structure of the semiconductor integrated circuit according to Fourth Embodiment.

FIG. 12 illustrates a structure in which three solder bumps are stacked vertically. According to the structure, an insulating layer 63 is further layered on the second insulating layer 56, and is covered with an insulating layer 62. Moreover, the insulating layer 63 is so layered that an external connection terminal 64 is provided as another external connection terminal. In case of a structure (not illustrated) in which four or more solder bumps are stacked vertically, an insulating layer(s) is(are) additionally layered as required by the number of the external connection terminals.

As above, in order to form electrical connection to each electronic component 58 of the semiconductor chip 52, it is necessary to form at least one lamination above the electronic component 58. Thus, it is possible to further reduce the mounting space on the printed-wiring board by mounting the electronic component 58 on the semiconductor chip in advance. In addition, it is also possible to make it easy to attain one-packaged IC. Moreover, in this case, the lamination (layer) formed above the electronic component 58 is a lamination remained after the semiconductor integrated circuit is produced.

Conventionally, there were no methods or arrangements for mounting the electronic component 58 on the semiconductor chip 52 and expanding the mounting space to the upper direction of the semiconductor chip during the wafer process.

[Fifth Embodiment]

FIGS. 9(a) and 9(b) illustrate a structure of a semiconductor integrated circuit which is realized by using the manufacturing method for the semiconductor integrated circuit of each of the above-mentioned embodiments and have a built-in triple booster charge pump circuit. FIG. 9(a) is a plan view of the semiconductor integrated circuit. FIG. 9(b) is a cross sectional view taken on line A—A of FIG. 9(a).

The semiconductor integrated circuit requires two fly capacitors (chip ceramic capacitors 65), one smoothing capacitor, and one bypass capacitor as external components. In the present embodiment, when a circuit requiring external components is built into the semiconductor integrated circuit as illustrated in FIGS. 9(a) and 9(b), the external components are mounted on the semiconductor chip in advance as the above-mentioned electronic components 8, 28, 38, and 58. Therefore, it is possible to reduce the mounting space on a printed-wiring board or to realize one-packaged IC.

The embodiments of the present invention are described so far. Whereas the semiconductor integrated circuit and the like are active components, the electronic component in each embodiment is a passive component and is generally said to be a "chip component". Typical examples of the passive components are a resistor, capacitor, inductor, and the like, and may be a thermister, varistor, metal (metal material) and/or the like.

Moreover, a drill is used to make apertures to insulating layers in the embodiments. A ball-shaped electrode used in a BGA type package has 0.3 mm in diameter and 0.5 mm of layout pitch, so that the apertures are made to the insulating layer by using the drill in order to substantially correspond to the diameter and the layout pitch of the electrode. Specifically, the making of the apertures by using the drill may be carried out as follows. A plurality of drills, which correspond to the apertures in terms of position and number, are used per IC chip. The drill make the apertures as being descended in a downward direction.

The present invention is not limited to the embodiments above, but may be modified within the scope of the claims. An embodiment based on a proper combination of technical means disclosed in the different embodiments is encompassed in the technical scope of the present invention.

[Conclusion of Embodiments]

The first manufacturing method for the semiconductor integrated circuit includes the steps of (a) forming a first insulating layer so that the first insulating layer covers that surface of a semiconductor chip on which a plurality of connection electrodes are provided, but has apertures at portions corresponding to the connection electrodes; and (b) electrically connecting electronic components with the plurality of connection electrodes, the electronic components being provided on an upper side of the semiconductor chip, the step (b) including forming a layer on the upper side of the semiconductor chip, the layer covering at least one of the electronic components.

According to the above manufacturing method, mounting space is expanded to the upper direction of the semiconductor chip during a wafer process of the semiconductor chip. Therefore, even where the mounting space in the in-plane direction of the semiconductor chip is limited, it is possible to increase the number of the electronic components to be mounted. As a result, it is possible to provide the manufacturing method for the semiconductor integrated circuit, in which the mounting space on the printed-wiring board can be further reduced by mounting the electronic component on the semiconductor chip in advance, and in which one-packaged IC can be attained.

The second manufacturing method for the semiconductor integrated circuit includes the steps of: forming a first insulating layer so that the first insulating layer covers that surface of a semiconductor chip on which a plurality of connection electrodes are provided, but has apertures at portions corresponding to the connection electrodes; and forming an electrical connection configuration in which an electronic component is electrically connected with the plurality of connection electrodes, the electronic component being provided on an upper side of the semiconductor chip and arranged vertically to the semiconductor chip.

According to the above manufacturing method, the electronic component is arranged vertically and is mounted on the upper side of the semiconductor chip. Above the electronic component, a wire is formed as electrical connection to the electronic component. That is, mounting space is expanded to the upper direction of the semiconductor chip during a wafer process of the semiconductor chip. Therefore, even where the mounting space in the in-plane direction of the semiconductor chip is limited, it is possible to increase the number of the electronic components to be mounted. As a result, it is possible to provide the manufacturing method for the semiconductor integrated circuit, in which the mounting space on the printed-wiring board can be further reduced by mounting the electronic component on the semiconductor chip in advance, and in which one-packaged IC can be attained.

The third manufacturing method for the semiconductor integrated circuit includes the steps of: forming a first insulating layer so that the first insulating layer covers that surface of a semiconductor chip on which a plurality of connection electrodes are provided, but has apertures at portions corresponding to the connection electrodes; forming an electrical connection configuration in which an electronic component is electrically connected with the plurality of connection electrodes, the electronic component being provided on an upper side of the semiconductor chip; and forming a second insulating layer on an upper side of the first insulating layer so as to cover the first insulating layer and the electronic component.

According to the above manufacturing method, the second insulating layer is formed above the electronic component. Therefore, it is possible to further mount the electronic component on the upper side of the second insulating layer and to form electrical connection to the electronic component. That is, mounting space is expanded to the upper direction of the semiconductor chip during a wafer process of the semiconductor chip. Therefore, even where the mounting space in the in-plane direction of the semiconductor chip is limited, it is possible to increase the number of the electronic components to be mounted. As a result, it is possible to provide the manufacturing method for the semiconductor integrated circuit, in which the mounting space on the printed-wiring board can be further reduced by mounting the electronic component on the semiconductor chip in advance, and in which one-packaged IC can be attained.

The fourth manufacturing method for the semiconductor integrated circuit includes the steps of: forming a first insulating layer so that the first insulating layer covers that surface of a semiconductor chip on which a plurality of connection electrodes are provided, but has apertures at portions corresponding to the connection electrodes; forming an electrical connection configuration in which an electronic component is electrically connected with the plurality of connection electrodes, the electronic component being provided on an upper side of the semiconductor chip; forming a second insulating layer on an upper side of the first insulating layer so as to cover the first insulating layer and the electronic component; and making an aperture to the second insulating layer.

According to the above manufacturing method, the second insulating layer is formed above the electronic component, and the apertures are made to the second insulating layer. Therefore, it is possible to further mount the electronic component on the second insulating layer, and to form electrical connection to the electronic component via the apertures. That is, mounting space is expanded to the upper direction of the semiconductor chip during a wafer process of the semiconductor chip. Therefore, even where the mounting space in the in-plane direction of the semiconductor chip is limited, it is possible to increase the number of the electronic components to be mounted. As a result, it is possible to provide the manufacturing method for the semiconductor integrated circuit, in which the mounting space on the printed-wiring board can be further reduced by mounting the electronic component on the semiconductor chip in advance, and in which one-packaged IC can be attained.

The fifth manufacturing method for the semiconductor integrated circuit includes the steps of: forming a first insulating layer so that the first insulating layer covers that surface of a semiconductor chip on which a plurality of connection electrodes are provided, but has apertures at portions corresponding to the connection electrodes; forming an electrical connection configuration in which an electronic component is electrically connected with the plurality of connection electrodes, the electronic component being provided on an upper side of the semiconductor chip; forming a second insulating layer on an upper side of the first insulating layer so as to cover the first insulating layer and the electronic component; and making an aperture to the second insulating layer with a drill.

According to the above manufacturing method, the second insulating layer is formed above the electronic component, and the apertures are made to the second insulating layer by using the drill. Therefore, it is possible to further mount the electronic component on the second insulating layer, and to form electrical connection to the electronic component via the apertures. That is, mounting space is expanded to the upper direction of the semiconductor chip during a wafer process of the semiconductor chip. Therefore, even where the mounting space in the in-plane direction of the semiconductor chip is limited, it is possible to increase the number of the electronic components to be mounted. As a result, it is possible to provide the manufacturing method for the semiconductor integrated circuit, in which the mounting space on the printed-wiring board can be further reduced by mounting the electronic component on the semiconductor chip in advance, and in which one-packaged IC can be attained.

The sixth manufacturing method for the semiconductor integrated circuit includes the steps of: forming a first insulating layer so that the first insulating layer covers that surface of a semiconductor chip on which a plurality of connection electrodes are provided, but has apertures at portions corresponding to the connection electrodes; forming an electrical connection configuration in which an electronic component is electrically connected with the plurality of connection electrodes, the electronic component being provided on an upper side of the semiconductor chip; forming a second insulating layer on an upper side of the first insulating layer so as to cover the first insulating layer and the electronic component; mounting another electronic component on the second insulating layer; making an aperture to the second insulating layer; and electrically connecting the connection electrodes with the another electronic component provided on the second insulating layer.

According to the above manufacturing method, the second insulating layer is formed above the electronic component, and the apertures are made to the second insulating layer. Therefore, it is possible to further mount the electronic component on the second insulating layer, and to form electrical connection to the electronic component via the apertures. That is, mounting space is expanded to the upper direction of the semiconductor chip during a wafer process of the semiconductor chip. Therefore, even where the mounting space in the in-plane direction of the semiconductor chip is limited, it is possible to increase the number of the electronic components to be mounted. As a result, it is possible to provide the manufacturing method for the semiconductor integrated circuit, in which the mounting space on the printed-wiring board can be further reduced by mounting the electronic component on the semiconductor chip in advance, and in which one-packaged IC can be attained.

The seventh manufacturing method for the semiconductor integrated circuit includes the steps of: forming a first insulating layer so that the first insulating layer covers that surface of a semiconductor chip on which a plurality of connection electrodes are provided, but has apertures at portions corresponding to the connection electrodes; forming an electrical connection configuration in which an electronic component is electrically connected with the plurality of connection electrodes, the electronic component being provided on an upper side of the semiconductor chip; forming a second insulating layer on an upper side of the first insulating layer so as to cover the first insulating layer and the electronic components; making apertures to the second insulating layer; and causing the connection electrodes to be exposed on the second insulating layer by using (i) the apertures of the second insulating layer and (ii) wires.

According to the above manufacturing method, the second insulating layer is formed above the electronic component, the apertures are made to the second insulating layer, and the wires are used for electrical connection. Therefore, it is possible to further mount the electronic component on the second insulating layer, and to form electrical connection to the electronic component via the apertures. That is, mounting space is expanded to the upper direction of the semiconductor chip during a wafer process of the semiconductor chip. Therefore, even where the mounting space in the in-plane direction of the semiconductor chip is limited, it is possible to increase the number of the electronic components to be mounted. As a result, it is possible to provide the manufacturing method for the semiconductor integrated circuit, in which the mounting space on the printed-wiring board can be further reduced by mounting the electronic component on the semiconductor chip in advance, and in which one-packaged IC can be attained.

The eighth manufacturing method for the semiconductor integrated circuit includes the steps of: (i) forming a plurality of insulating layers on an upper side of the semiconductor chip having a plurality of connection electrodes on a surface thereof; (ii) during the step (i), mounting electronic components between the insulating layers and on the uppermost insulating layer; (iii) forming wires for establishing electronic connection between the electronic components and the connection electrodes; (iv) making apertures to the insulating layers in order to establish the electronic connection between the electronic components and the connection electrodes; and (v) establishing electronic connection between the electronic components and the connection electrodes.

According to the above manufacturing method, the insulating layers are provided above the electronic components, and the apertures are made to the insulating layers. Therefore, it is possible to further mount the electronic components on the insulating layers, and to form electrical connection to the electronic components via the apertures. That is, mounting space is expanded to the upper direction of the semiconductor chip during a wafer process of the semiconductor chip. Therefore, even where the mounting space in the in-plane direction of the semiconductor chip is limited, it is possible to increase the number of the electronic components to be mounted. As a result, it is possible to provide the manufacturing method for the semiconductor integrated circuit, in which the mounting space on the printed-wiring board can be further reduced by mounting the electronic component on the semiconductor chip in advance, and in which one-packaged IC can be attained.

The ninth manufacturing method for the semiconductor integrated circuit includes the steps of: forming a first insulating layer so that the first insulating layer covers that surface of a semiconductor chip on which a plurality of connection electrodes are provided, but has apertures at portions corresponding to the connection electrodes; forming a plurality of wires on the first insulating layer, the wires each connected to respective connection electrodes at one end and having, on the other end, an electrode pad for external-connection-terminal connection; forming, respectively on all or some of the wires, connection pads for component-connection-terminal connection; connecting an electronic component between the connection pads; forming an external connection terminal, which is located on each of the electrode pads, the external connection terminal being a first solder bump; and covering, with a second insulating layer, an entire surface, including the external connection terminals, of the semiconductor chip.

According to the above manufacturing method, the second insulating layer is formed above the electronic component, and the external connection terminals are exposed from the second insulating layer for electrical connection. Therefore, the second insulating layer and the external connection terminals are provided according to the height of the electronic component. Then, it is possible to form electrical connection to the electronic component above the electronic component. That is, mounting space is expanded to the upper direction of the semiconductor chip during a wafer process of the semiconductor chip. Therefore, even where the mounting space in the in-plane direction of the semiconductor chip is limited, it is possible to increase the number of the electronic components to be mounted. As a result, it is possible to provide the manufacturing method for the semiconductor integrated circuit, in which the mounting space on the printed-wiring board can be further reduced by mounting the electronic component on the semiconductor chip in advance, and in which one-packaged IC can be attained.

It is preferable that the ninth manufacturing method include a step of making an aperture with a drill to the second insulating layer covering the external connection terminals and the entire surface of the semiconductor chip. By the apertures made to the second insulating layer, the external connection terminals are exposed from the second insulating layer. This makes it possible to form electrical connection to the upper direction.

Alternatively, it is preferable that the ninth manufacturing method include the steps of: making apertures to the second insulating layer covering the external connection terminals and the entire surface of the semiconductor chip; and extending the external connection terminals to above the second insulating layer via the apertures of the second insulating layer. By the apertures made to the second insulating layer, the external connection terminals are exposed from the second insulating layer. This makes it possible to form electrical connection to the upper direction.

Alternatively, it is preferable that the ninth manufacturing method include the steps of: making apertures to the second insulating layer covering the external connection terminals and the entire surface of the semiconductor chip; and extending the external connection terminals to above the second insulating layer via the apertures of the second insulating layer by using wires. By the apertures made to the second insulating layer, the external connection terminals are exposed from the second insulating layer. This makes it possible to form electrical connection to the upper direction by using the wires.

Alternatively, it is preferable that the ninth manufacturing method include the steps of: causing only the external connection terminals to be exposed; and connecting other external connection terminals respectively to the external connection terminals, each of the other external connection terminals being a second solder bump. By the apertures made to the second insulating layer, only the external connection terminals are exposed from the second insulating layer. This makes it possible to form electrical connection to the upper direction by using the other external connection terminals.

The tenth manufacturing method for the semiconductor integrated circuit includes the steps of: forming a first insulating layer so that the first insulating layer covers that surface of a semiconductor chip on which a plurality of connection electrodes are provided, but has apertures at portions corresponding to the connection electrodes; forming a plurality of wires on the first insulating layer, the wires each connected to respective connection electrodes at one end and having, on the other end, an electrode pad for external-connection-terminal connection; forming, respectively on all or some of the wires, connection pads for component-connection-terminal connection; connecting an electronic component between the connection pads, the electronic component being arranged vertically with respect to the semiconductor chip; forming an external connection terminal, which is located on each of the electrode pads and is a first solder bump; connecting one ends of the electronic components to other external connection terminals; and covering, with a second insulating layer, an entire surface, including the external connection terminals, of the semiconductor chip.

According to the above manufacturing method, the second insulating layer is formed above the electronic component, and the external connection terminals are exposed from the second insulating layer for electrical connection. Therefore, the second insulating layer and the external connection terminals are provided according to the height of the electronic component which is arranged vertically. Then, it is possible to form electrical connection to the electronic component above the electronic component. That is, mounting space is expanded to the upper direction of the semiconductor chip during a wafer process of the semiconductor chip. Therefore, even where the mounting space in the in-plane direction of the semiconductor chip is limited, it is possible to increase the number of the electronic components to be mounted. As a result, it is possible to provide the manufacturing method for the semiconductor integrated circuit, in which the mounting space on the printed-wiring board can be further reduced by mounting the electronic component on the semiconductor chip in advance, and in which one-packaged IC can be attained.

It is preferable that the first semiconductor integrated circuit includes: a semiconductor chip having a plurality of connection electrodes on a surface thereof; a first insulating layer covering the surface of the semiconductor chip and having apertures at portions corresponding to the connection electrodes; a plurality of wires electrically connected with the connection electrodes; electronic components mounted on an upper side of the semiconductor chip, the electronic components being to be electrically connected with the connection electrodes through the wires; and a layer, on the upper side of the electronic component, for covering at least one of the electronic components, in order to provide a structure for electrically connecting the electronic components.

According to the above semiconductor integrated circuit, mounting space is expanded to the upper direction of the semiconductor chip. Therefore, even where the mounting space in the in-plane direction of the semiconductor chip is limited, it is possible to increase the number of the electronic components to be mounted. As a result, it is possible to provide the semiconductor integrated circuit, in which the mounting space on the printed-wiring board can be further reduced by mounting the electronic component on the semiconductor chip in advance, and in which one-packaged IC can be attained.

It is preferable that the second semiconductor integrated circuit, in the first semiconductor integrated circuit, include: a second insulating layer provided on an upper side of the first insulating layer, so as to position the electronic components under or within the second insulating layer and to cover the first insulating layer with the second insulating layer; and another electronic component mounted on an upper side of the second insulating layer. With this, the second insulating layer is formed above the electronic component, and the electronic component is further mounted on the upper side of the second insulating layer. Therefore, it is possible to expand mounting space for the electronic component to the upper direction of the semiconductor chip by forming electrical connection to the electronic component on the upper side of the second insulating layer.

It is preferable that the third semiconductor integrated circuit has, in addition to the arrangement of the second integrated circuit including the second insulating layer, an arrangement to include: the second insulating layer having an aperture for allowing electrical connection between the another electronic component mounted on the upper side of the second insulating layer, and the wires covered with the second insulating layer; and another wire for electrically connecting between, via the aperture, the another electronic component mounted on the upper side of the second insulating layer, and the wires covered with the second insulating layer. With this, it is possible to electrically connect the electronic component on the upper side of the second insulating layer with the wires covered with the second insulating layer.

It is preferable that each of the fourth semiconductor integrated circuits, in the first through third semiconductor integrated circuits, include: an insulating layer formed on the upper side of the first insulating layer and the semiconductor chip, the insulating layer having an aperture for allowing the electrical connection between the electronic component, and the wires that are located under the insulating layer; another electronic component mounted on the insulating layer; and another wire for electrically connecting between, via the aperture, the another electronic component, and the wire that are located under the insulating layer. With this, it is possible to electrically connect the electronic component mounted to the insulating layer with the wires in the insulating layer.

It is preferable that each of the fifth semiconductor integrated circuits, in the first through fourth semiconductor integrated circuits, include: component connection terminals formed at that portion of the wire which is between a connection electrode and an electronic component or at that portion of a wire from which the wire branches off; and another electronic component connected between the component connection terminals. With this, it is possible to connect the electronic component to the connection electrodes.

It is preferable that the sixth semiconductor integrated circuit has, in addition to the arrangement of the first through fifth semiconductor integrated circuits, an arrangement to include an external connection terminal formed to each of the wires. With this, it is possible to connect the external connection terminals to the connection electrodes.

It is preferable that a back surface of the semiconductor chip of each of the seventh semiconductor integrated circuits, in the first to sixth semiconductor integrated circuits, be polished. With this, the size of the semiconductor integrated circuit becomes applicable for mounting.

In the first semiconductor integrated circuit apparatus, it is preferable that (i) any one of the first through sixth semiconductor integrated circuits be mounted to a die pad, (ii) the connection electrodes and lead terminals be electrically connected through the wires, (iii) the semiconductor integrated circuit, the die pad, and the wires be sealed with a resin, and (iv) the lead terminals be partially exposed. With the above arrangement, it is possible to provide the semiconductor integrated circuit apparatus in which the semiconductor integrated circuit is packaged in the style of TSOP or the like.

In the second semiconductor integrated circuit apparatus, it is preferable that (i) any one of the first through fifth and seventh semiconductor integrated circuits be mounted on one surface of a printed circuit board composed of an insulating substrate and conductive portions, (ii) the connection electrodes and the conductive portions of the printed circuit board be electrically connected through wires, (iii) the semiconductor integrated circuit and the wires be sealed with a resin, and (iv) external connection terminals electrically connected with the conductive portions be formed on the other surface of the printed circuit board. With this, it is possible to provide the semiconductor integrated circuit apparatus in which the semiconductor integrated circuit is packaged in the style of CSP or the like.

The eighth semiconductor integrated circuit includes: a semiconductor chip having a plurality of connection electrodes on a surface thereof; a first insulating layer covering the surface of the semiconductor chip and having apertures at portions corresponding to the connection electrodes; a plurality of wires on the first insulating layer, the wires each connected to respective connection electrodes at one end and having, on the other end, an electrode pad; connection pads, provided respectively on all or some of the wires, for component-connection-terminal connection; an electronic component connected between the connection pads; external connection terminals respectively located on the electrode pads and being a first solder bump; and a second insulating layer, which covers an entire surface, including the external connection terminals, of the semiconductor chip.

According to the above semiconductor integrated circuit, the second insulating layer is formed above the electronic component, and the external connection terminals are exposed from the second insulating layer for electrical connection. Therefore, the second insulating layer and the external connection terminals are provided according to the height of the electronic component. Then, it is possible to form electrical connection to the electronic component above the electronic component. Moreover, it is possible to form electrical connection to electronic component mounted on the upper side of the second insulating layer. That is, mounting space for the electronic component is expanded to the upper direction of the semiconductor chip. Therefore, even where the mounting space in the in-plane direction of the semiconductor chip is limited, it is possible to increase the number of the electronic components to be mounted. As a result, it is possible to provide the manufacturing method for the semiconductor integrated circuit, in which the mounting space on the printed-wiring board can be further reduced by mounting the electronic component on the semiconductor chip in advance, and in which one-packaged IC can be attained.

It is preferable that the ninth semiconductor integrated circuit has, in addition to the arrangement of the eighth semiconductor integrated circuit, an arrangement to include: the second insulating layer having an aperture and covering the external connection terminal and the semiconductor chip; and another external connection terminal on an upper side of the second insulating layer, the another external connection terminal configured to be electrically connected with the external connection terminal via the aperture. By the apertures made to the second insulating layer, the external connection terminals are exposed from the second insulating layer. This makes it possible to form electrical connection to the upper direction of the second insulating layer by the other external connection terminals.

In the tenth semiconductor integrated circuit, it is preferable that, in the eighth semiconductor integrated circuit, only the external connection terminals made of the first solder bumps are exposed from the second insulating layer, and other external connection terminals are provided so that they are electrically connected to the external connection terminals exposed and are second solder bumps. By the apertures made to the second insulating layer, only the external connection terminals are exposed from the second insulating layer. This makes it possible to form electrical connection to the upper direction of the second insulating layer by the other external connection terminals.

It is preferable that the eleventh semiconductor integrated circuit has, in addition to the arrangement of the eighth through tenth semiconductor integrated circuits, an arrangement to include at least one of the connection pads being located at that portion of the wire which is between a connection electrode and an electronic component or at that portion of a wire from which the wire branches off. With this, the electronic component can be connected to the connection electrodes.

It is preferable that the twelfth semiconductor integrated circuit has, in addition to the arrangement of the eighth semiconductor integrated circuit, an arrangement to have a structure where another external connection terminal is provided to each external connection terminal, so that a structure in which three or more solder bumps stacked vertically is formed with each another external connection terminal and each external connection terminal. With this, it is possible to mount a lot of electronic components.

In the thirteenth semiconductor integrated circuit, it is preferable that, in the eighth through eleventh semiconductor integrated circuits, a back surface of the semiconductor chip be polished. With this, the size of the semiconductor integrated circuit becomes applicable for mounting.

As above, the manufacturing method, semiconductor integrated circuit, and semiconductor integrated circuit apparatus in the embodiments of the present invention can be preferably used for semiconductor packages such as TSOP and CSP.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A semiconductor integrated circuit, comprising:
    a semiconductor chip having a plurality of connection electrodes on a surface thereof;
    a first insulating layer covering the surface of the semiconductor chip and having apertures at portions corresponding to the connection electrodes;
    a plurality of wires electrically connected with the connection electrodes;
    electronic components mounted on an upper side of the semiconductor chip, the electronic components being to be electrically connected with the connection electrodes through the wires; and,
    a layer, on the upper side of the semiconductor chip, for covering at least one of the electronic components, in order to provide a structure for electrical connection configuration in which the at least one of the electronic components has electrical connection with the connection electrodes.

2. The semiconductor integrated circuit as set forth in claim 1, further comprising:
    a second insulating layer provided on an upper side of the first insulating layer, so as to position the electronic components under or within the second insulating layer and to cover the first insulating layer with the second insulating layer; and
    another electronic component mounted on an upper side of the second insulating layer.

3. The semiconductor integrated circuit as set forth in claim 2, wherein:
    the second insulating layer has an aperture for allowing electrical connection between the another electronic component mounted on the upper side of the second insulating layer, and the wires covered with the second insulating layer; and
    the semiconductor integrated circuit further comprises another wire for electrically connecting between, via the aperture, (i) the another electronic component mounted on the upper side of the second insulating layer, (ii) and the wires covered with the second insulating layer.

4. The semiconductor integrated circuit as set forth in claim 1, further comprising:
    an insulating layer formed on the upper side of the first insulating layer and the semiconductor chip, the insulating layer having an aperture for allowing the electrical connection between the electronic component, and the wires that are located under the insulating layer;
    another electronic component mounted on the insulating layer; and
    another wire for electrically connecting between, via the aperture, the another electronic component, and the wire that are located under the insulating layer.

5. The semiconductor integrated circuit as set forth in claim 1, further comprising:
    component connection terminals formed at that portion of the wire which is between a connection electrode and an electronic component or at that portion of a wire from which the wire branches off; and
    another electronic component connected between the component connection terminals.

6. The semiconductor integrated circuit as set forth in claim 1, further comprising an external connection terminal formed to each of the wires.

7. The semiconductor integrated circuit as set forth in claim 1, wherein a back surface of the semiconductor chip is polished.

8. A semiconductor integrated circuit apparatus comprising:
    a semiconductor integrated circuit, including:
        a semiconductor chip having a plurality of connection electrodes on a surface thereof;
        a first insulating layer covering the surface of the semiconductor chip and having apertures at portions corresponding to the connection electrodes;
        a plurality of wires electrically connected with the connection electrodes;
        electronic components mounted on an upper side of the semiconductor chip, the electronic components being to be electrically connected with the connection electrodes through the wires; and,
        a layer, on the upper side of the semiconductor chip, for covering at least one of the electronic components, in order to provide a structure for electrical connection configuration in which the at least one of the electronic components has electrical connection with the connection electrodes,
    a die pad for mounting the semiconductor integrated circuit thereon;

wires for electrically connecting the connection electrodes with lead terminals; and a resin for sealing the semiconductor integrated circuit, the die pad, and the wires in such a manner that the lead terminals are partially exposed.

9. The semiconductor integrated circuit apparatus as set forth in claim 8, wherein the semiconductor integrated circuit includes:

a second insulating layer provided on an upper side of the first insulating layer, so as to position the electronic components under or within the second insulating layer and to cover the first insulating layer with the second insulating layer; and another electronic component mounted on an upper side of the second insulating layer.

10. The semiconductor integrated circuit apparatus as set forth in claim 9, wherein:

the second insulating layer has an aperture for allowing electrical connection between the electronic component mounted on the upper side of the second insulating layer, and the wires covered with the second insulating layer; and the semiconductor integrated circuit further comprises another wire for electrically connecting between, via the aperture, the electronic component mounted on the upper side of the second insulating layer, and the wires covered with the second insulating layer.

11. The semiconductor integrated circuit apparatus as set forth in claim 8, wherein the semiconductor integrated circuit includes:

an insulating layer formed on the upper side of the first insulating layer and the semiconductor chip, the insulating layer having an aperture for allowing the electrical connection between the electronic component, and the wires that are located under the insulating layer;

another electronic component mounted on the insulating layer; and another wire for electrically connecting between, via the aperture, the another electronic component, and the wire that are located under the insulating layer.

12. The semiconductor integrated circuit apparatus as set forth in claim 8, wherein the semiconductor integrated circuit including:

another electronic component connected between the component connection terminals; and component connection terminals for connecting between the another electronic component to that portion of the wire which is between a connection electrode and an electronic component or at that portion of a wire from which the wire branches off.

13. The semiconductor integrated circuit apparatus comprising:

a semiconductor integrated circuit, including:

a semiconductor chip having a plurality of connection electrodes on a surface thereof;

a first insulating layer covering the surface of the semiconductor chip and having apertures at portions corresponding to the connection electrodes;

a plurality of wires electrically connected with the connection electrodes;

electronic components mounted on an upper side of the semiconductor chip, the electronic components being to be electrically connected with the connection electrodes through the wires; and, a layer, on the upper side of the semiconductor chip, for covering at least one of the electronic components, in order to provide a structure for electrical connection configuration in which the at least one of the electronic components has electrical connection with the connection electrodes, a printed circuit board having an insulating substrate, a conductive portion, and one surface on which the semiconductor integrated circuit is mounted;

a wire for electrically connecting the connection electrodes with the conductive portion of the printed circuit board;

a resin for sealing the semiconductor integrated circuit and the wire; and an external connection terminals formed on the other surface of the printed circuit board and electrically connected with the conductive portion.

14. The semiconductor integrated circuit apparatus as set forth in claim 13, wherein the semiconductor integrated circuit including:

a second insulating layer provided on an upper side of the first insulating layer, so as to position the electronic components under or within the second insulating layer and to cover the first insulating layer with the second insulating layer; and another electronic component mounted on an upper side of the second insulating layer.

15. The semiconductor integrated circuit apparatus as set forth in claim 14, wherein:

the second insulating layer has an aperture for allowing electrical connection between the another electronic component mounted on the upper side of the second insulating layer, and the wires covered with the second insulating layer; and the semiconductor integrated circuit further comprises another wire for electrically connecting between, via the aperture, the another electronic component mounted on the upper side of the second insulating layer, and the wires covered with the second insulating layer.

16. The semiconductor integrated circuit apparatus as set forth in claim 13, wherein the semiconductor integrated circuit including:

an insulating layer formed on the upper side of the first insulating layer and the semiconductor chip, the insulating layer having an aperture for allowing the electrical connection between the electronic component, and the wires that are located under the insulating layer;

another electronic component mounted on the insulating layer; and another wire for electrically connecting between, via the aperture, the another electronic component, and the wire that are located under the insulating layer.

17. The semiconductor integrated circuit apparatus as set forth in claim 13, wherein the semiconductor integrated circuit includes:

component connection terminals formed at that portion of the wire which is between a connection electrode and an electronic component or at that portion of a wire from which the wire branches off; and another electronic component connected between the component connection terminals.

18. The semiconductor integrated circuit apparatus as set forth in claim 13, wherein a back surface of the semiconductor chip is polished.

19. A semiconductor integrated circuit comprising:

a semiconductor chip having a plurality of connection electrodes on a surface thereof;

a first insulating layer covering the surface of the semiconductor chip and having apertures at portions corresponding to the connection electrodes;

a plurality of wires on the first insulating layer, the wires each connected to respective connection electrodes at one end and having, on the other end, an electrode pad;

connection pads, provided respectively on all or some of the wires, for component-connection-terminal connection;

an electronic component connected between the connection pads;

external connection terminals respectively located on the electrode pads and being a first solder bump; and a second insulating layer, which covers an entire surface, including the external connection terminals, of the semiconductor chip.

20. The semiconductor integrated circuit as set forth in claim 19, wherein:

the second insulating layer has an aperture; and the semiconductor integrated circuit further comprises another external connection terminal on an upper side of the second insulating layer in the semiconductor integrated circuit, the another external connection terminal configured to be electrically connected with the external connection terminal via the aperture.

21. The semiconductor integrated circuit as set forth in claim 19, wherein:

only the external connection terminals are exposed from the second insulating layer, the semiconductor integrated circuit further comprises other external connection terminals which are electrically connected to the external connection terminals exposed and being a second solder bump.

22. The semiconductor integrated circuit as set forth in claim 19, wherein:

at least one of the connection pads is located at that portion of the wire which is between a connection electrode and an electronic component or at that portion of a wire from which the wire branches off.

23. The semiconductor integrated circuit as set forth in claim 19, further comprising:

another external connection terminal provided to each external connection terminal, so that a structure in which three or more solder bumps stacked vertically is formed with each another external connection terminal and each external connection terminal.

24. The semiconductor integrated circuit as set forth in claim 19, wherein a back surface of the semiconductor chip is polished.

* * * * *